US010132656B2

United States Patent
Liu

(10) Patent No.: US 10,132,656 B2
(45) Date of Patent: *Nov. 20, 2018

(54) MEASUREMENT METHOD AND ENCODER DEVICE, AND EXPOSURE METHOD AND DEVICE

(71) Applicant: NIKON CORPORATION, Tokyo (JP)

(72) Inventor: Zhigiang Liu, Kawasaki (JP)

(73) Assignee: NIKON CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/964,230

(22) Filed: Apr. 27, 2018

(65) Prior Publication Data

US 2018/0259368 A1 Sep. 13, 2018

Related U.S. Application Data

(63) Continuation of application No. 14/397,312, filed as application No. PCT/JP2013/057309 on Mar. 14, 2013, now Pat. No. 9,983,028.

(Continued)

(51) Int. Cl.
*G01B 11/00* (2006.01)
*G01B 11/02* (2006.01)
(Continued)

(52) U.S. Cl.
CPC .............. *G01D 5/347* (2013.01); *G01D 5/38* (2013.01); *G02B 5/1861* (2013.01); *G03F 7/20* (2013.01)

(58) Field of Classification Search
CPC .. G01D 5/34746; G01D 5/38; G03F 7/70775; H01L 21/68–21/682

(Continued)

(56) References Cited

U.S. PATENT DOCUMENTS 5,610,715 A 3/1997 Yoshii et al.
6,611,316 B2 8/2003 Sewell
(Continued)

FOREIGN PATENT DOCUMENTS

JP H07-270122 A 10/1995
JP 2008070363 A 3/2008
(Continued)

OTHER PUBLICATIONS

Jun. 18, 2013 International Search Report issued in Japanese Patent Application No. PCT/JP2013/057309.
(Continued)

*Primary Examiner* — Colin Kreutzer
(74) *Attorney, Agent, or Firm* — Oliff PLC

(57) ABSTRACT

There is provided an encoder device to measure a relative moving amount between a first and second members. The encoder device includes: a reflective-type diffraction grating on the first member; a light source unit to radiate a measuring light; a first optical member on the second member; a first and second reflecting units on the second member that cause first and third diffracted lights generated via diffraction of the measuring light and having orders different from each other to come into the diffraction grating respectively, and cause second and fourth diffracted lights generated via diffraction of the first and third diffracted lights respectively to come into the first optical member; photo-detectors configured to detect interference lights between two diffracted lights and other light beam respectively; and a measuring unit to obtain the relative moving amount by using detection signals from the photo-detectors.

22 Claims, 12 Drawing Sheets

Related U.S. Application Data

(60) Provisional application No. 61/638,719, filed on Apr. 26, 2012.

(51) Int. Cl.
| | |
|---|---|
| *G01B 11/14* | (2006.01) |
| *G03B 27/32* | (2006.01) |
| *G03B 27/58* | (2006.01) |
| *G03B 27/62* | (2006.01) |
| *H02K 7/00* | (2006.01) |
| *H02K 41/02* | (2006.01) |
| *G01D 5/347* | (2006.01) |
| *G03F 7/20* | (2006.01) |
| *G01D 5/38* | (2006.01) |
| *G02B 5/18* | (2006.01) |

(58) Field of Classification Search
USPC ..... 310/12.05, 12.06, 12.19; 355/67, 72, 75, 355/77; 356/399–401, 498–500, 614–616
See application file for complete search history.

(56) References Cited

U.S. PATENT DOCUMENTS

| | | | |
|---|---|---|---|
| 6,778,257 B2 | 8/2004 | Bleeker et al. | |
| 7,023,610 B2 | 4/2006 | Ohtsuki et al. | |
| 8,134,688 B2 | 3/2012 | Shibazaki | |
| 2003/0025890 A1 | 2/2003 | Nishinaga | |
| 2008/0062432 A1 | 3/2008 | Sandig et al. | |
| 2012/0032067 A1 | 2/2012 | Goodwin et al. | |
| 2013/0114061 A1 | 5/2013 | de Groot et al. | |
| 2013/0114062 A1 | 5/2013 | Liesener | |
| 2013/0128255 A1 | 5/2013 | Liu | |

FOREIGN PATENT DOCUMENTS

| | | |
|---|---|---|
| WO | 01/35168 A1 | 5/2001 |
| WO | 2013/070957 A1 | 5/2013 |

OTHER PUBLICATIONS

Jun. 18, 2013 Written Opinion issued in Japanese Patent Application No. PCT/JP2013/057309.
Mar. 17, 2017 Office Action issued in U.S. Appl. No. 14/397,312.
Aug. 14, 2017 Office Action issued in U.S. Appl. No. 14/397,312.
Jan. 30, 2018 Notice of Allowance issued in U.S. Appl. No. 14/397,312.
Jan. 19, 2017 Requirement for Election/Restriction issued in U.S. Appl. No. 14/397,312.
Sep. 5, 2018 Office Action issued in Japanese Patent Application No. 2017-195721.

MEASUREMENT METHOD AND ENCODER DEVICE, AND EXPOSURE METHOD AND DEVICE

CROSS-REFERENCE

This application is a continuation of U.S. application Ser. No. 14/397,312 filed Feb. 10, 2015, which is a U.S. national phase entry of International Application No. PCT/JP2013/057309 which was filed on Mar. 14, 2013 claiming the conventional priority of Provisional Patent Application No. 61/638,719, filed on Apr. 26, 2012 and the disclosures of the above applications are incorporated herein by reference in their entirety.

TECHNICAL FIELD

The present teaching relates to a measurement method and an encoder device which measure a relative moving amount between members moving relative to each other; an exposure technology using the measurement method and the encoder device; and a method for producing a device using the exposure technology.

BACKGROUND ART

In an exposure apparatus such as a so-called stepper or scanning stepper, which is used in the photolithography process for producing electronic devices (micro devices) such as semiconductor devices, etc., a laser interferometer is conventionally used to measure the position of a stage moving a substrate as the exposure objective. In the laser interferometer, however, the optical path for a measuring beam is long and tends to vary (change), and thus there is a short-term change (variation) of the measured value caused due to the temperature fluctuation (change, variation) in the atmosphere on the optical path, which is becoming all the more unignorable.

In order to address the above-described situation, for example, there is utilized in recent years a so-called encoder device (interfering type encoder) which irradiates a measuring light (measuring light beam) composed of a laser light (laser light beam) onto a diffraction grating fixed on a member (stage, etc.), and which measures a relative moving amount of the stage having the diffraction grating provided thereon, from a detection signal obtained by photo-electrically converting an interference light (interference light beam) generated by interference between a diffracted light (diffracted light beam) generated from the diffraction grating and other diffracted light or a reference light (reference light beam) (see, for example, U.S. Pat. No. 8,134,688). This encoder device has more excellent short-term stability in the measured value than the laser interferometer, and has become to be capable of achieving a resolving power which is close to that of the laser interferometer.

SUMMARY

In a conventional encoder device, a diffracted light generated from the diffraction grating is reflected by a planar mirror, etc. Accordingly, there is a fear that when the height of a grating pattern surface of the diffraction grating is changed or varied, the diffracted light from the grating pattern surface might be shifted relative to the other diffracted light or the reference light, thereby lowering the signal intensity of the interference light.

An aspect of the present teaching is to address such a problem described above, and an object of the aspect is to prevent the lowering of signal intensity of the interference light caused, when the relative moving amount is measured by using the diffraction grating, due to a change in the height of the grating pattern surface.

According to a first aspect of the present teaching, there is provided an encoder device configured to measure a relative moving amount between a first member and a second member, which is supported to be movable relative to the first member at least in a first direction. The encoder device includes: a reflective-type diffraction grating provided on the first member and having a grating pattern of which periodic direction is at least the first direction; a light source unit configured to radiate a measuring light; a first optical member provided on the second member and causing the measuring light to come substantially perpendicularly into a surface of the grating pattern of the diffraction grating; a first reflecting unit provided on the second member, causing a first diffracted light, which is generated, via diffraction of the measuring light, from the diffraction grating in the first direction, to come into the diffraction grating, and causing a second diffracted light, which is generated, via diffraction of the first diffracted light, from the diffraction grating, to come into the first optical member; a second reflecting unit provided on the second member, causing a third diffracted light, of which order is different from that of the first diffracted light and which is generated, via diffraction of the measuring light, from the diffraction grating in the first direction, to come into the diffraction grating, and causing a fourth diffracted light, which is generated, via diffraction of the third diffracted light, from the diffraction grating, to come into the first optical member; a first photo-detector configured to detect an interference light generated by interference between the second diffracted light via the first optical member and other light beam than the second diffracted light; a second photo-detector configured to detect an interference light generated by interference between the fourth diffracted light via the first optical member and other light beam than the fourth diffracted light; and a measuring unit configured to obtain the relative moving amount between the first member and the second member by using detection signals from the first and second photo-detectors.

According to a second aspect of the present teaching, there is provided an encoder device configured to measure a relative moving amount between a first member and a second member, which is supported to be movable relative to the first member at least in a first direction. The encoder device includes a reflective-type diffraction grating provided on the first member and having a grating pattern of which periodic direction is at least the first direction; a light source unit configured to radiate a measuring light; a first optical member provided on the second member and causing the measuring light to come into a first position on a surface of the grating pattern of the diffraction grating; a first reflecting unit provided on the second member and causing a first diffracted light, which is generated, via diffraction of the measuring light, from the diffraction grating in the first direction, to come into a second position on the diffraction grating; and a second reflecting unit provided on the second member and causing a third diffracted light, of which order is different from that of the first diffracted light and which is generated, via diffraction of the measuring light, from the diffraction grating in the first direction, to come into a third position on the diffraction grating. Both of the second position and the third position are different, in a second direction perpendicular to the first direction, from a first line segment at which a first plane and the reflective-type diffraction grating cross or intersect, the first plane including the first position, a path of the first diffracted light travelling from the diffraction grating to the first reflecting unit and a path of the second diffracted light travelling from the diffraction grating to the second reflecting unit.

Further, according to a third aspect of the present teaching, there is provided an exposure apparatus configured to expose an object to be exposed with a pattern, the exposure apparatus including: a frame; a stage configured to support the object and configured to be movable relative to the frame at least in a first direction; and the encoder device as defined in the first aspect or the second aspect configured to measure a relative moving amount between the frame and the stage at least in the first direction.

Further, according to a fourth aspect of the present teaching, there is provided a measuring method for measuring a relative moving amount between a first member and a second member, which is supported to be movable relative to the first member at least in a first direction. This measuring method includes: causing a measuring light to come substantially perpendicularly into a surface of a grating pattern, of which periodic direction is at least the first direction, of a reflective-type diffraction grating provided on the first member, via a first optical member provided on the second member; causing a first diffracted light, which is generated, via diffraction of the measuring light, from the diffraction grating in the first direction, to come into the diffraction grating by a first reflecting unit provided on the second member, and causing a second diffracted light, which is generated, via diffraction of the first diffracted light, from the diffraction grating, to come into the first optical member by the first reflecting unit; causing a third diffracted light, of which order is different from that of the first diffracted light and which is generated, via diffraction of the measuring light, from the diffraction grating in the first direction, to come into the diffraction grating by a second reflecting unit provided on the second member, and causing a fourth diffracted light, which is generated, via diffraction of the third diffracted light, from the diffraction grating, to come into the first optical member by the second reflecting unit; detecting an interference light generated by interference between the second diffracted light via the first optical member and other light beam than the second diffracted light; detecting an interference light generated by interference between the fourth diffracted light via the first optical member and other light beam than the fourth diffracted light; and obtaining the relative moving amount between the first member and the second member based on the detection results.

Further, according to a fifth aspect of the present teaching, there is provided a measuring method for measuring a relative moving amount between a first member and a second member, which is supported to be movable relative to the first member at least in a first direction. This measuring method includes: causing a measuring light to come into a first position on a grating pattern, of which periodic direction is at least the first direction, of a reflective-type diffraction grating provided on the first member; causing a first diffracted light, which is generated, via diffraction of the measuring light, from the diffraction grating in the first direction, to come into a second position on the diffraction grating; and causing a third diffracted light, of which order is different from that of the first diffracted light and which is generated, via diffraction of the measuring light, from the diffraction grating in the first direction, to come into a third position on the diffraction grating. Both of the second position and the third position are different, in a second direction perpendicular to the first direction, from a first line segment at which a first plane and the reflective-type diffraction grating cross or intersect, the first plane including the first position, a path of the first diffracted light travelling from the diffraction grating to the first reflecting unit and a path of the second diffracted light travelling from the diffraction grating to the second reflecting unit.

Further, according to a sixth aspect of the present teaching, there is provided an exposure method for exposing an object to be exposed with a pattern, the object being supported by a stage configured to be movable relative to a frame at least in a first direction, the exposure method including, measuring a relative moving amount between the stage and the frame at least in the first direction by using the measuring method as defined in the fourth aspect or the fifth aspect.

Further, according to a seventh aspect of the present teaching, there is provided a method for producing a device, including a lithography step, wherein an object is exposed in the lithography step by using the exposure apparatus as defined in the third aspect or the exposure method as defined in the sixth aspect.

DESCRIPTION OF EMBODIMENTS

First Embodiment

Figure 1:
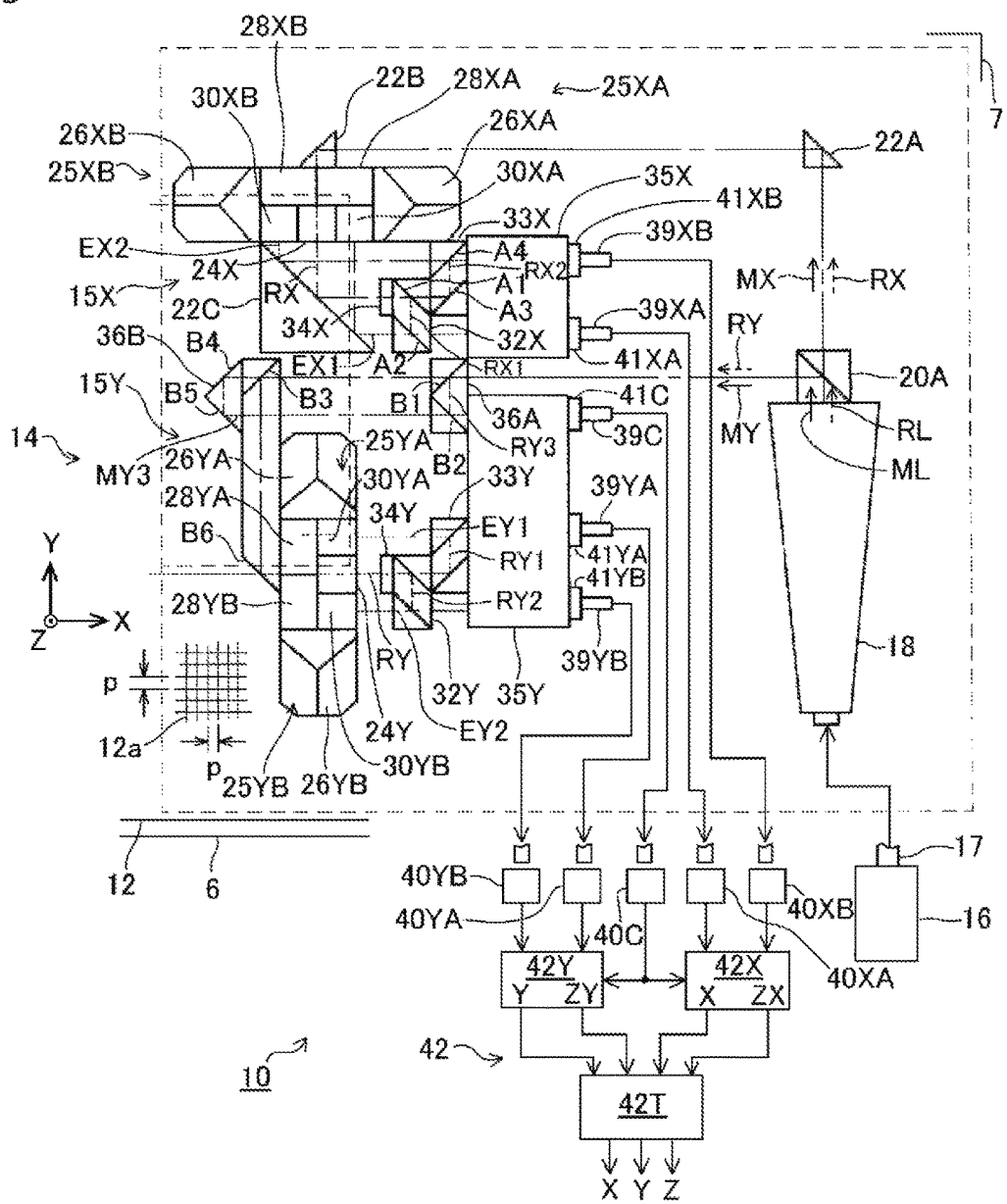
FIG. 1 is a plan view of an encoder according to a first embodiment of the present teaching.

A first embodiment of the present teaching will be explained with reference to FIG. 1 to FIG. 4B. FIG. 1 is a plan view depicting an encoder 10 according to the embodiment. In FIG. 1, as an example, a second member 7 is disposed to be movable three-dimensionally relative to a first member 6. The following explanation will be made assuming that the X axis and the Y axis extend parallel to two relative-movement directions, respectively, which are orthogonal to each other and in which the second member 7 is movable relative to the first member 6, and the Z axis extends in a relative movement direction which is orthogonal to a plane (XY plane) defined by the X axis and the Y axis and in which the second member is movable relative to the first member 6. Further, angles of rotation (inclinations) about the axes parallel to the X axis, the Y axis, and the Z axis are designated as angles in θx, θy, and θz directions respectively.

In FIG. 1, the encoder 10 has a two-dimensional diffraction grating 12 which has a flat plate-shape (planar shape) substantially parallel to the XY plane, and which is fixed to the upper surface of the first member 6; a detection head 14 which is fixed to the second member 7; a laser light source 16 and an optical fiber 17 which supply a laser light (laser light beam) for measurement to the detection head 14; optical fibers 39XA, 39XB, 39YA, 39YB, and 39C which transmit or deliver a plurality of interference lights generated in the detection head 14; photoelectric sensors 40XA, 40XB, 40YA, 40YB, and 40C, such as photodiodes, which receive the interference lights supplied via the optical fibers 39XA, 39XB, 39YA, 39YB, and 39C to output detection signals; and a measurement calculation unit 42 (42X, 42Y, 42T) which processes the detection signals to obtain movement amounts of a three-dimensional relative movement of the second member 7 relative to the first member 6, that is movement amounts in the X, Y, and Z directions. The detection head 14 includes an X-axis interferometer unit 15X which irradiates a measuring light to the diffraction grating 12 to generate a plurality of interference lights formed or generated by interference between a reference light and a plurality of diffracted lights generated in the X direction from the diffraction grating 12; an Y-axis interferometer unit 15Y which irradiates the measuring light to the diffraction grating 12 to generate a plurality of interference lights formed or generated by interference between a reference light and a plurality of diffracted lights generated in the Y direction from the diffraction grating 12; other optical members; and support members 35X and 35Y which are fixed to the second member 7 to support the optical members and in which a plurality of openings, which allow light beam to pass through the inside thereof, are formed.

The diffraction grating 12 has a grating pattern surface 12b which is substantially parallel to the XY plane; a two-dimensional grating pattern 12a, which has a predetermined period (pitch) p in each of the X and Y directions and which is a phase-type and reflective-type grating, is formed on the grating pattern surface 12b. The periods p in the X and Y directions of the grating pattern 12a are, as an example, each about 100 nm to about 4 μm (for example, 1 μm period). Note that the period in the X direction and the period in the Y direction of the grating pattern 12a may be different from each other. The grating pattern 12a may be produced, for example, as a hologram (for example, those obtained by printing interference fringes onto a photosensitive resin). Alternatively, the grating pattern 12a may be produced by forming grooves, etc., mechanically in a glass plate, etc., and by coating the grooves, etc., with a reflective film. Further alternatively, the grating pattern surface 12b may be covered by a protective flat glass plate.

The laser light source 16 is composed, for example, of a He—Ne laser or a semiconductor laser, etc., and radiates, as an example, a two-frequency heterodyne light composed of first and second linearly polarized laser lights ML, RL of which frequencies are different from each other by a predetermined amount and of which polarization directions are orthogonal to each other. These laser lights are coherent with each other (in a case that the polarization directions are made to be parallel to each other); and the average wavelength of these laser lights is referred to as "λ". The laser light source 16 supplies, to the measurement calculation unit 42, a signal of reference frequency (reference signal) which is obtained by photo-electrically converting an interference light formed or generated by interference between two light beams branched from these laser lights respectively. Note that it is also allowable to use the homodyne interference system.

The optical fiber 17 is a double-core optical fiber of a polarization-preserving type which transmits the laser lights ML, RL emitted from the laser source 16 while maintaining respective polarization directions. In this embodiment, the first laser light ML emitted from the optical fiber 17 is a linearly polarized laser light polarized in the X direction parallel to the XY plane, and the second laser light RL emitted from the optical fiber 17 is a linearly polarized laser light polarized in the Z direction. The other optical fibers 39XA, 39XB, 39YA, 39YB, and 39C are single-core fibers, and they can be any of the polarization-preserving type fibers and a normal type fibers. Further, a light-collecting lens may be provided at a light-incident port of each of the other optical fibers 39XA, 39XB, 39YA, 39YB, and 39C. In FIG. 1, the illustration of intermediate parts of the optical fibers 17, 39XA, 39XB, 39YA, 39YB, and the like is omitted. It is allowable to use a beam-feeding optical system constructed of a plurality of mirrors instead of using the optical fiber 17, and/or it is allowable to directly receive the interference lights by the photoelectric sensors 40XA, 40XB, 40YA, 40YB, and 40C without using the optical fibers 39XA, 39XB, 39YA, 39YB, and 39C.

The detection head 14 includes a connection unit 18 having a lens 18b (see FIG. 2C) which makes the laser lights ML, RL emitted from the optical fiber 17 parallel light beams; a half prism 20A which divides the laser light ML emitted from the connection unit 18 into an X-axis measuring light MX and a Y-axis measuring light MY and which divides the laser light RL emitted from the connection unit 18 into an X-axis reference light RX and a Y-axis reference light RY; two mirrors 22A, 22B which cause the measuring light MX and the reference light RX to come into the X-axis interferometer unit 15X substantially in the −Y direction; and optical members 36A and 36B which cause greater parts of the measuring light MY and the reference light RY to come into the Y-axis interferometer unit 15Y substantially in the +X direction. In this embodiment, the X-axis measuring light MX and the X-axis reference light RX emitted from the half prism 20A are heterodyne beams which are respectively linearly polarized in the X direction and the Z direction, and the Y-axis measuring light MY and the Y-axis reference light RY emitted from the half prism 20A are heterodyne beams which are respectively linearly polarized in the Y direction and the Z direction. Each of the measuring lights MX, MY and the reference lights RX, RY has a circular-shaped cross section (elliptical-shaped cross section, a rectangular cross section, etc., are also allowable) which has a diameter of, for example, about 0.5 mm to several millimeters.

Figure 2A:
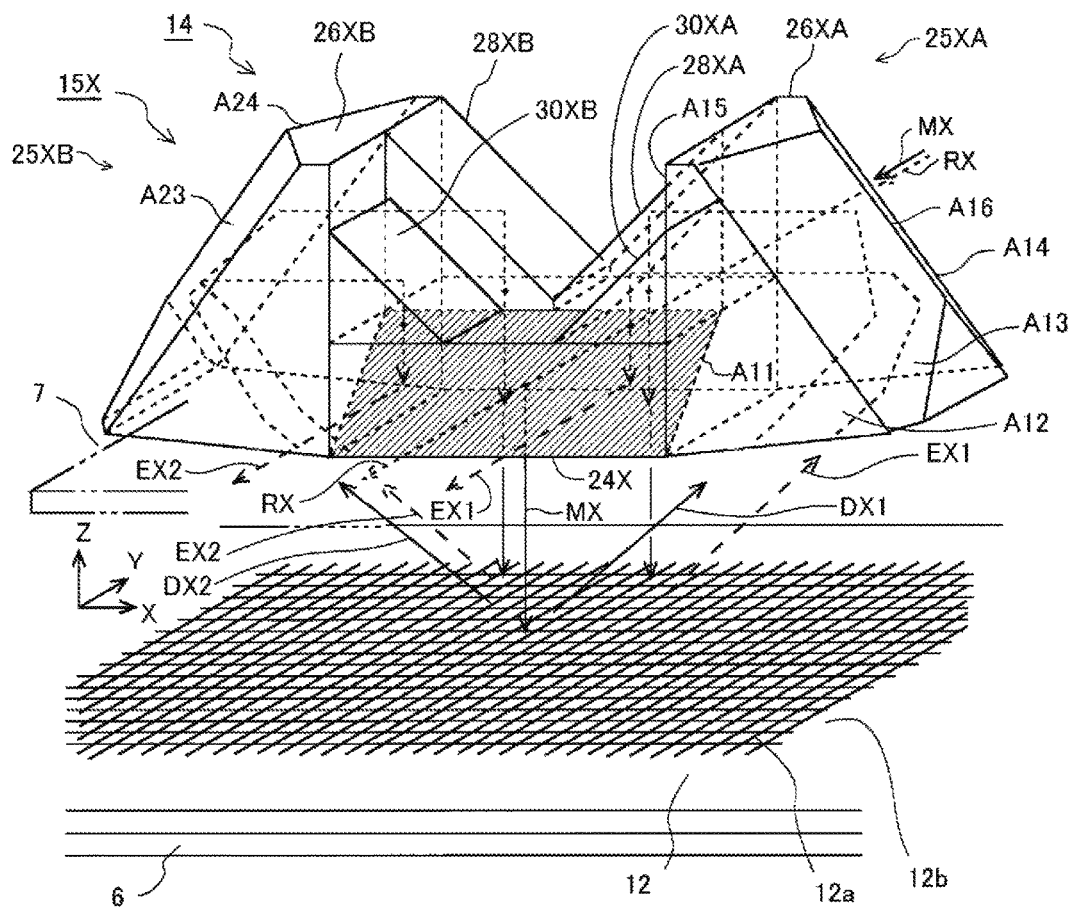
FIG. 2A is a perspective view illustrating main components or parts of an X-axis interferometer unit in FIG. 1.
Figure 2B:
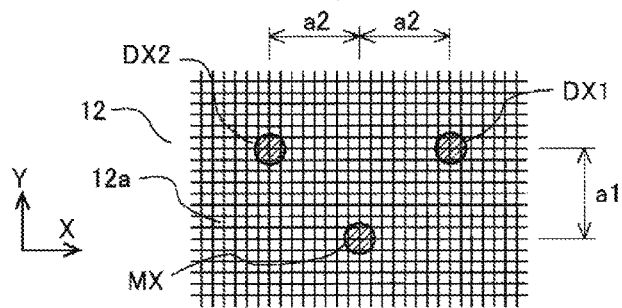
FIG. 2B is a plan view illustrating irradiation positions of a measuring light and a diffracted light in FIG. 2A.
Figure 2C:
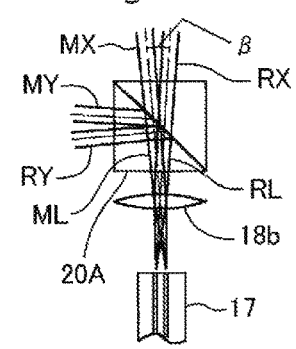
FIG. 2C is an illustrative view illustrating open angles of the measuring light and a reference light.

As depicted in FIG. 2C, the laser lights ML, RL are emitted from core portions arranged adjacently in the optical fiber 17 and are converted into the parallel light beams by the lens 18b. Thus, the laser lights ML, RL which have been converted into the parallel light beams intersect at a predetermined small angle β. Therefore, the measuring light MX and the reference light RX emitted from the half prism 20A are relatively inclined at the angle β, and further the measuring light MY and the reference light RY emitted from the half prism 20A are relatively inclined at the angle β. By relatively inclining the measuring light MX and the reference light RX (measuring light MY and reference light RY), it is possible to reduce the noise light which would be otherwise mixed to a finally detected interference light(s).

In FIG. 1, a combining or synthesizing optical member 32X is fixed to an end surface in the −X direction of the support member 35X arranged on the +Y direction side, via a combining or synthesizing optical member 33X. The combining optical member 32X includes a half mirror surface A1 and a polarized beam splitter surface (hereinafter referred to as "PBS surface") A2 which are parallel to a plane obtained by rotating the YZ plane counterclockwise by 45 degrees with the axis parallel to the Z axis as a rotation center. The combining optical member 33X includes a PBS surface A4 and a reflecting surface A3 which are parallel to a plane obtained by rotating the YZ plane clockwise by 45 degrees with the axis parallel to the Z axis as a rotation center. A wedge-shaped (cuneiform) prism 34X is fixed to a light-incident surface of the combining optical member 32X. Further, polarizing plates 41XA, 41XB are fixed to the end surface in the +X direction of the support member 35X at positions facing the PBS surfaces A2 and A4, respectively. Light-incident ends of the optical fibers 39XA, 39XB are fixed to the polarizing plates 41XA, 41XB, respectively.

In FIG. 1, an optical member 36A is fixed to the end portion in the +Y direction of the end surface in the −X direction of the support member 35Y arranged on the −Y direction side. The optical member 36A includes a PBS surface B2 and a beam splitter surface (hereinafter referred to as "BS surface") B1 which has a high transmittance and a low reflectance. Further, combining optical members 33Y, 32Y which are constituted in the same manner as the combining optical members 33X, 32X are fixed to an area at the side of the −Y direction of the end surface in the −X direction of the support member 35Y, and a wedge-shaped (cuneiform) prism 34Y which has the same shape as the edge-shaped prism 34X is fixed to a light-incident surface of the combining optical member 32Y. Polarizing plates 41YB, 41YA, and 41C are fixed to the end surface in the +X direction of the support member 35Y at positions facing the PBS surfaces of the combining optical members 32Y, 33Y and the PBS surface B2 of the optical member 36A, respectively. Light-incident ends of the optical fibers 39YB, 39YA, and 39C are fixed to the polarizing plates 41YB, 41YA, and 41C respectively. The direction of crystal axis of each of the polarizing plates 41XA, 41XB, 41YA, 41YB, and 41C is set to be an oblique direction so that the diffracted light or measuring light (to be described later) which is linearly polarized in the Y direction and which is subjected to the measurement is combined with the reference light linearly polarized in the Z direction to generate the interference light. The wedge-shaped prisms 34X, 34Y changes the traveling directions of the incoming reference lights RX, RY to cancel out the angle β between the measuring light MX and the reference light RX and the angle β between the measuring light MY and the reference light RY (see FIG. 2C), thereby making the reference lights parallel to the diffracted lights to be measured.

The optical member 36B includes a BS surface B3 which has a low transmittance and a high reflectance, two reflecting surfaces B4, B5 which are substantially orthogonal with each other, and a reflecting surface B6 disposed at a position away from the BS surface B3 in the −Y direction. Regarding the Y-axis measuring light MY and the Y-axis reference light RY which are branched by the half prism 20A, greater parts thereof are transmitted through the BS surface B1 of the optical member 36A; a part of the measuring light MY and a part of the reference light (reference light RY3) reflected by the BS surface B1 come into the PBS surface B2; and the S-polarized reference light RY3 is reflected by the PBS surface B2. Regarding the measuring light MY and the reference light RY transmitted through the BS surface B1, greater parts thereof are reflected by the BS surface B3 of the optical member 36B, and the reflected measuring light MY and reference light RY come into the Y-axis interferometer unit 15Y substantially from the −X direction via the reflecting surface B6.

A part of the measuring light (measuring light MY3) and a part of the reference light RY transmitted through the BS surface B3 are reflected by the reflecting surfaces B4, B5 to come into the PBS surface B2 of the optical member 36A, and the P-polarized measuring light MY3 is transmitted through the PBS surface B2 and is combined with the reference light RY3 reflected by the PBS surface B2, thereby forming the interference light for comparison or reference. The interference light for comparison comes into the optical fiber 39C via the polarizing plate 41C, and the interference light delivered by the optical fiber 39C is received by the photoelectric sensor 40C. As an example, the position and the angle of reflecting surface B5 of the optical member 36B are set, as an example, to adjust the position and the angle of the measuring light MY3, so that the measuring light MY3 and the reference light RY3 combined by the PBS surface B2 are coaxial and parallel to each other.

The X-axis interferometer unit 15X includes a polarized beam splitter member (hereinafter referred to as "PBS member") 24X, a pair of roof prisms 26XA, 26XB, a pair of large-size reflecting members 28XA, 28XB of a right-angle prism type, and a pair of small-size reflecting members 30XA, 30XB of a right-angle prism type. The PBS member 24X has a polarized beam splitter surface (hereinafter referred to as "PBS surface") A11 (see FIG. 2A) into which the measuring light MX and the reference light RX reflected substantially in the −Y direction by the mirror 22B come. The pair of roof prisms 26XA, 26XB is symmetrically fixed to sandwich the PBS member 24X in the X direction. The pair of reflecting members 28XA, 28XB is fixed on the upper surface of the PBS member 24X at the side of the +Y direction symmetrically in the X direction to face the outside. The pair of reflecting members 30XA, 30XB is fixed on the upper surface of the PBS member 24X at the side of the −Y direction symmetrically in the X direction to face the outside. The X-axis interferometer unit 15X further includes a reflecting member 22C, the wedge-shaped prism 34X, and the combining optical members 32X, 33X.

A first reflecting unit 25XA is constructed of the roof prism 26XA and the reflecting members 28XA, 30XA at the side of the +X direction. A second reflecting unit 25XB is constructed of the roof prism 26XB and the reflecting members 28XB, 30XB at the side of the −X direction. Opening(s) (not depicted) for allowing the measuring light MX and the diffracted light emitted from the diffraction grating 12 to pass is/are formed in the second member 7, and the PBS member 24 is fixed to the second member 7 to cover the opening(s) therewith.

FIG. 2A depicts the PBS member 24X and the reflecting units 25XA, 25XB of the interferometer unit 15X in FIG. 1. In FIG. 2A, the PBS member 24X is a member having a double-layered structure as follows. That is, the interior of a part, defined at the side of the +Y direction, to which the large-size reflecting members 28XA, 28XB are fixed is a transmitting part, and in the interior of a part, defined at the side of the −Y direction, to which the small-size reflecting members 30XA, 30XB are fixed, the PBS surface A11 is obliquely formed (in a state of being inclined at 45 degrees to the XY surface around the X axis). The PBS member 24X has a rectangular parallelepiped shape surrounded by six surfaces of two surfaces parallel to the XY plane, two surfaces parallel to the YZ plane, and two surfaces parallel to the ZX plane. The PBS member 24X, however, may have other shapes. The roof prism 26XA of the reflecting unit 25XA includes a light-incident surface A12, a pair of reflecting surfaces A13, A14, and a light-exit surface A15. The light-incident surface A12 is inclined counterclockwise to the bottom surface of the PBS member 24X by an angle α1 (see FIG. 3A). The pair of reflecting surfaces A13, A14 is formed by arranging the reflecting surfaces A13 and A14 symmetrical with respect to a ridge line A16 parallel to the XZ plane and orthogonal to each other. The light-exit surface A15 is brought in tight contact with the PBS member 24X and the reflecting members 28XA, 30XA. The ridge line A16 of the roof prism 26XA is inclined counterclockwise to the ZY plane by an angle α2 (see FIG. 3A). The other roof prism 26XB has a shape symmetrical to the roof prism 26XA. The roof prism 26XB also includes two reflecting surfaces A23, A24 which are orthogonal to each other.

The S-polarized measuring light MX and the P-polarized reference light RX reflected by the mirror 22B in FIG. 1 come into the PBS surface A11 of the PBS member 24X of FIG. 2A substantially from the +Y direction. The reference light RX is transmitted through the PBS surface A11 and is emitted from the PBS member 24 substantially in the −Y direction. Meanwhile, the S-polarized measuring light MX is reflected by the PBS surface A11 to come into the grating pattern surface 12b (grating pattern 12a) of the diffraction grating 12X perpendicularly (substantially parallel to the Z axis). The term "to come into (the grating pattern surface 12b) perpendicularly" herein means including not only a case that the measuring light MX is caused to come into the grating pattern surface 12b perpendicularly, but also a case that the measuring light MX is caused to come substantially perpendicularly into the grating pattern surface 12b while being inclined, for example, at about 0.5 degree to about 1.5 degrees, with respect to an axis parallel to the Z axis, in the X direction (θy direction) and/or in the Y direction (θx direction) for the purpose of lowering the effect or influence brought about by the 0-order light (regular reflection light).

In this embodiment, there are generated ±1st order diffracted lights DX1 and DX2, which are symmetric in the X direction, via diffraction of the measuring light MX coming substantially perpendicularly into the grating pattern surface 12b of the diffraction grating 12. The generated diffracted light DX1 comes into a light-incident surface of the roof prism 26XA, and the generated diffracted light DX2 comes into a light-incident surface of the roof prism 26XB. In this situation, ±1st order diffracted lights are also generated symmetrically in the Y direction, but the diffracted lights in the Y direction are not used in the X-axis interferometer unit 15X. The +1st order diffracted light DX1 shifts in the +Y direction via the light-incident surface A12 and the reflecting surfaces A13, A14 of the roof prism 26XA, and travels in the −X direction parallel to the X axis to come into the reflecting member 28XA via the light-exit surface A15. Then, the diffracted light DX1 reflected by the reflecting member 28XA is transmitted through the PBS member 24X to come substantially perpendicularly into the grating pattern surface 12b of the diffraction grating 12. Symmetrical to the +1st order diffracted light DX1, the −1st order diffracted light DX2 shifts in the +Y direction via the reflecting surfaces A23, A24, etc., of the roof prism 26XB, and travels in the +X direction parallel to the X axis to come into the reflecting member 28XB. Then, the diffracted light DX2 reflected by the reflecting member 28XB comes substantially perpendicularly into the grating pattern 12a of the diffraction grating 12.

As depicted in FIG. 2B, positions, in the grating pattern 12a, into which the diffracted lights DX1, DX2 come are each shifted from the position, in the grating pattern 12a, into which the measuring light MX comes by a spacing distance a1 in the Y direction and a spacing distance a2 in the X direction. Shifts, in the X direction, of the positions into which the diffracted lights DX1, DX2 come are symmetric with respect to the measuring light MX. The distance a1 is approximately ½ of the width of the PBS member 24X in the Y direction, and the distance a2 is approximately ⅓ of the width of the PBS member 24X in the X direction. By allowing the measuring light MX and the diffracted lights DX1, DX2 to come into the diffraction grating 12 in accordance with the above arrangement, it is possible to downsize the structure of the interferometer unit 15X. Noted that each of the spacing distances a1, a2 may be any spacing distance. Further, the positions into which the measuring light MX and the diffracted lights DX1, DX2 come may be set in accordance with any arrangement.

There are generated +1st order diffracted light EX1 (double-diffracted light) and −1st order diffracted light EX2 (double-diffracted light) via diffraction of the diffracted lights DX1, DX2 reflected by the reflecting members 28XA, 28XB respectively, from the diffraction grating 12 symmetrically in the X direction. The diffracted light EX1 shifts in the −Y direction by being reflected by the light-incident surface A12 and the reflecting surfaces A14, A13 of the roof prism 26XA in this order, and travels in the −X direction parallel to the X axis to come into the reflecting member 30XA. The S-polarized diffracted light EX1 reflected by the reflecting member 30XA is reflected by the PBS surface A11 of the PBS member 24X and is emitted from the PBS member 24X substantially in the −Y direction. Symmetrical to the diffracted light EX1, the diffracted light EX2 shifts in the −Y direction by being reflected by the light-incident surface and the reflecting surfaces A24, A23 of the roof prism 26XB in this order, and travels in the +X direction parallel to the X axis to come into the reflecting member 30XB. Then, the S-polarized diffracted light EX2 reflected by the reflecting member 30XB is reflected by the PBS surface A11 and is emitted from the PBS member 24X substantially in the −Y direction.

In FIG. 1, the diffracted lights EX1, EX2 emitted from the PBS member 24X are reflected by the reflecting member 22C, and the reflected diffracted lights EX1, EX2 are transmitted through the PBS surfaces A2, A4 of the combining optical members 32X, 33X, respectively. The reason thereof is that although each of the diffracted lights EX1, EX2 has the S-polarization to the PBS surface A11 of the PBS member 24X, each of the diffracted lights EX1, EX2 has the P-polarization to one of the PBS surfaces A2, A4. The reference light RX transmitted through the PBS member 24X is reflected by the reflecting member 22C to come into the half mirror surface A1 of the combining optical member 32X via the wedge-shaped prism 34X. A reference light RX1 reflected by the half mirror surface A1 is reflected by the PBS surface A2 and then is coaxially combined with the diffracted light EX1, thereby forming the interference light. This interference light is received by the photoelectric sensor 40XA via the polarizing plate 41XA and the optical fiber 39XA. A reference light RX2 transmitted through the half mirror surface A1 is reflected by the reflecting surface A3 of the combining optical member 33X. After that, the reflected reference light RX2 is reflected by the PBS surface A4 and then is coaxially combined with the diffracted light EX2, thereby forming the interference light. This interference light is received by the photoelectric sensor 40XB via the polarizing plate 41XB and the optical fiber 39XB. The reason thereof is that although each of the reference lights RX1, RX2 has the P-polarization to the PBS surface A11 of the PBS member 24X, each of the reference lights RX1, RX2 has the S-polarization to one of the PBS surfaces A2, A4.

The Y-axis interferometer unit 15Y includes a PBS member 24Y and reflecting units 25YA, 25YB those of which are configured by integrally rotating the PBS member 24X and the reflecting units 25XA, 25XB of the X-axis interferometer unit 15X by 90 degrees. That is, the reflecting units 25YA, 25YB also include roof prisms 26YA, 26YB, large-size reflecting members 28YA, 28YB, and small-size reflecting members 30YA, 30YB, respectively. The PBS member 24Y is fixed to the second member 7 to cover opening(s) (not depicted) therewith. The interferometer unit 15Y further includes the wedge-shaped prism 34Y and the combining or synthesizing optical members 32Y, 33Y.

The measuring light MY and reference light RY reflected by the reflecting surface B6 come into the PBS member 24Y of the Y-axis interferometer unit 15Y. The P-polarized reference light RY is transmitted through the PBS surface of the PBS member 24Y and is emitted in the +X direction. The S-polarized measuring light MY is reflected by the PBS surface of the PBS member 24Y to come substantially perpendicularly into the grating pattern 12a of the diffraction grating 12, which generates, from the grating pattern 12a, ±1st order diffracted lights DY1, DY2 (see FIG. 3B) which are symmetric in the Y direction. The ±1st order diffracted light generated in the X direction are not used in the interferometer unit 15Y. The diffracted light DY1 (DY2) comes substantially perpendicularly into the grating pattern 12a of the diffraction grating 12 via the reflecting unit 25YA (reflecting unit 25YB). Then, +1st order diffracted light EY1 in the Y direction generated via diffraction of the diffracted light DY1 and −1st order diffracted light EY2 in the Y direction generated via diffraction of the diffracted light DY2 are generated from the diffraction grating 12. The diffracted light EY1 travels through the reflecting unit 25YA, is reflected by the PBS surface of the PBS member 24Y and is emitted in the +X direction. The diffracted light EY2 travels through the reflecting unit 25YB, is reflected by the PBS surface of the PBS member 24Y and is emitted in the +X direction.

The P-polarized diffracted lights EY1, EY2 emitted from the PBS member 24Y are transmitted through the PBS surfaces of the combining optical members 33Y, 32Y, respectively. The reference light RY transmitted through the PBS member 24Y comes into a half mirror surface of the combining optical member 32Y via the wedge-shaped prism 34Y. A reference light RY2 reflected by the half mirror surface is reflected by the PBS surface and then is coaxially combined with the diffracted light EY2, thereby forming the interference light. This interference light is received by the photoelectric sensor 40YB via the polarizing plate 41YB and the optical fiber 39YB. A reference light RY1 transmitted through the half mirror surface is reflected by the reflecting surface of the combining optical member 33Y. After that, the reflected reference light RY1 is reflected by the PBS surface and then is coaxially combined with the diffracted light EY1, thereby forming the interference light. This interference light is received by the photoelectric sensor 40YA via the polarizing plate 41YA and the optical fiber 39YA.

In FIG. 1, the measurement calculation unit 42 has a first calculation unit 42X, a second calculation unit 42Y and a third calculation unit 42T. The X-axis photoelectric sensor 40XA supplies a detection signal (photo-electric conversion signal) of an interference light generated by interference between the diffracted light EX1 and the reference light RX1 to the first calculation unit 42X, and the X-axis photoelectric sensor 40XB supplies a detection signal of an interference light generated by interference between the diffracted light EX2 and the reference light RX2 to the first calculation unit 42X. Further, the Y-axis photoelectric sensor 40YA supplies a detection signal of an interference light generated by interference between the diffracted light EY1 and the reference light RY1 to the second calculation unit 42Y, and the Y-axis photoelectric sensor 40YB supplies a detection signal of an interference light generated by interference between the diffracted light EY2 and the reference light RY2 to the second calculation unit 42Y. A signal of the reference frequency (reference signal) from the laser light source 16 and a signal (comparison signal) of the interference light for comparison, detected by the photoelectric sensor 40C, having substantially the reference frequency are supplied to the first calculation unit 42X and the second calculation unit 42Y.

Here, relative moving amounts (relative displacement) of the second member 7 relative to the first member 6 in the X, Y and Z directions are referred to as "X", "Y" and "Z", respectively; and relative moving amounts in the Z direction obtained in the first calculation unit 42X and the second calculation unit 42Y are referred to as "ZX" and "ZY", respectively. In this case, as an example, the first calculation unit 42X obtains a first relative moving amount (a·X+b·ZX) in the X and Z directions from the detection signal and the reference signal (or comparison signal) of the photoelectric sensor 40XA by using previously known coefficients "a" and "b"; the first calculation unit 42X obtains a second relative moving amount (−a·X+b·ZX) in the X and Z directions from the detection signal and the reference signal (or comparison signal) of the photoelectric sensor 40XB; the first calculation unit 42X obtains a X-direction relative moving amount (X) and a Z-direction relative moving amount (ZX) from the first and second relative moving amounts; and then the first calculation unit 42X supplies the calculation results to the third calculation unit 42T. The second calculation unit 42Y obtains a first relative moving amount (a·Y+b·ZY) in the Y and Z directions from the detection signal and the reference signal (or comparison signal) of the photoelectric sensor 40YA; the second calculation unit 42Y obtains a second relative moving amount (−a·Y+b·ZX) in the Y and Z directions from the detection signal and the reference signal (or comparison signal) of the photoelectric sensor 40YB; the second calculation unit 42Y obtains a Y-direction relative moving amount (Y) and a Z-direction relative moving amount (ZY) from the first and second relative moving amounts; and then the second calculation unit 42Y supplies the calculation results to the third calculation unit 42T.

The third calculation unit 42T outputs, as the relative moving amounts of the second member 7 relative to the first member 6 in the X and Y directions, values obtained by correcting the relative moving amount (X) and the relative moving amount (Y), which are supplied from the first and second calculation units 42X and 42Y respectively, by predetermined offsets. Further, as an example, the third calculation unit 42T outputs, as the relative moving amount of the second member 7 relative to the first member 6 in the Z direction, a value obtained by correcting an average value (=(ZX+ZY)/2) of the relative moving amount (ZX) and the relative moving amount (ZY) in the Z direction, which are supplied from the first and second calculation units 42X and 42Y respectively, by a predetermined offset. The detection resolving powers of the relative moving amounts in the X, Y and Z directions are, for example, about 0.5 nm to about 0.1 nm. Since the optical paths of the measuring lights MX, MY, etc. are short in the encoder 10, it is possible to reduce the short-term change (variation) of the measured value due to the temperature fluctuation of the air on the optical path. Further, since the interference light generated by interference between the +1st order diffracted lights EX1 and EY1 which are double diffracted lights and the reference lights RX1 and RY1 corresponding to the +1st order diffracted lights EX1 and EY1 and the interference light generated by interference between the −1st order diffracted lights EX2 and EY2 which are double diffracted lights and the reference lights RX2 and RY2 corresponding to the −1st order diffracted lights EX2 and EY2 are finally detected, the detection resolving power (detection precision) of the relative movement amount can be improved (miniaturized) to ½. Furthermore, by using the ±1st order diffracted lights, it is possible to reduce any measurement error due to the relative rotational angle between the first member 6 and the second member 7 in the θz direction.

Figure 3A:
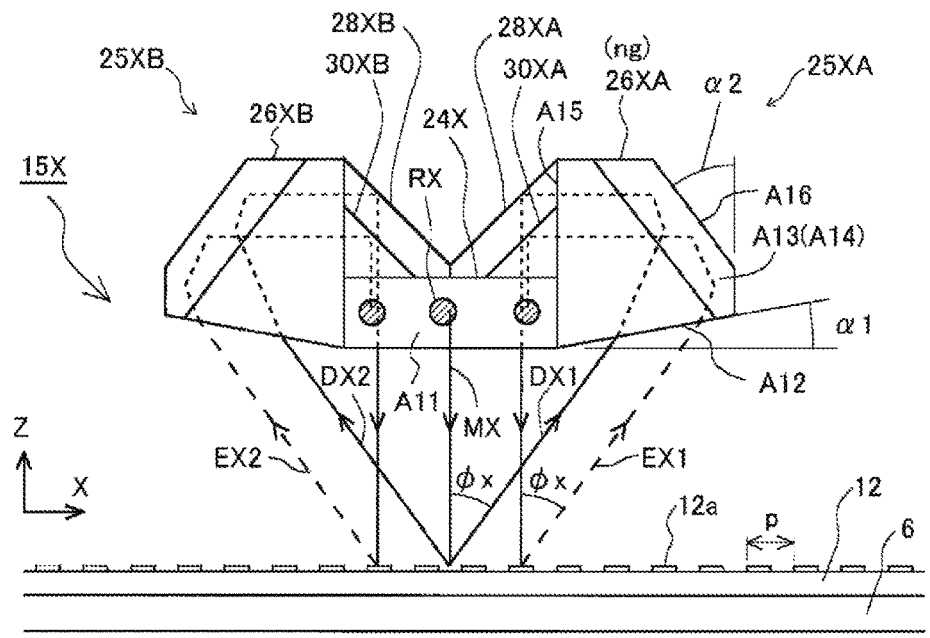
FIG. 3A is a diagram depicting optical paths of ±1 order diffracted lights in an X direction in the X-axis interferometer unit of FIG. 2A.

Next, the optical path of the diffracted light of the detection head 14 of the embodiment will be explained in detail. FIG. 3A depicts main components or parts of the X-axis interferometer unit 15X and the diffraction grating 12. In FIG. 3A, when the measuring light MX comes perpendicularly into the grating pattern 12a of the diffraction grating 12 (when the measuring light comes into the grating pattern 12a in parallel to the Z axis), a diffraction angle $\phi x$ of the +1st order diffracted light DX1 in the X-direction brought about by the measuring light MX satisfies the following relation using the period p of the grating pattern 12a and the wavelength λ of the measuring light MX. At this time, a diffraction angle of the −1st order diffracted light DX2 in the X direction brought about by the measuring light MX is −$\phi x$.

$$p \cdot \sin(\phi x) = \lambda \quad (1)$$

As an example, provided that the period p is 1,000 nm (1 μm) and the wavelength λ of the measuring light MX is 633 nm, then the diffraction angle $\phi X$ is approximately 39 degrees. Further, the diffracted light DX1 is bent by the roof prism 26XA (light-incident surface A12 and reflecting surfaces A13, A14) and the reflecting member 28XA to be parallel to the measuring light MX (here, parallel to the Z axis), and the diffracted light DX1 comes again into the diffraction grating 12. Therefore, the angle α1 of the light-incident surface A12 of the roof prism 26XA, the angle α2 of the ridge line A16, a refractive index ng, and an incident angle i (function of the angle α1 and the diffraction angle $\phi X$) of the diffracted light DX1 with respect to the light-incident surface A12 are preferably set so that the diffracted light DX1 reflected by the reflecting member 28XA is substantially parallel to the Z axis.

Further, in this embodiment, it is preferable that a rate of change (dδ/di) of a deflection angle δ of the diffracted light DX1 coming into the light-incident surface A12 of the roof prism 26XA with respect to the incident angle i is set to be cos($\phi x$), as indicated below.

$$d\delta/di = \cos(\phi x) = \cos\{\arcsin(\lambda/p)\} \quad (3)$$

The condition which is defined by this formula (3) means that the rate of change (dδ/di) of the deflection angle δ at the light-incident surface A12 cancels out the rate of change in the diffraction angle of the diffracted light DX1 brought about when the incident angle of the measuring light MX with respect to the diffraction grating 12 is changed from 0 (zero) (to be described in detail later on).

In a case that the measuring light MX comes perpendicularly into the grating pattern 12a (in a case that the measuring light comes into the grating pattern 12a in parallel to the Z axis), the diffracted light DX1 reflected by the reflecting unit 25XA comes perpendicularly into the grating pattern 12a at a position shifted in the +X direction and the +Y direction from the position where the measuring light MX came into the grating pattern 12a (see FIG. 2B). The diffraction angle of the +1st order diffracted light EX1 generated, via diffraction of the diffracted light DX 1, from the grating pattern 12a is same as "$\phi x$" of the formula (1); and the optical path of the diffracted light EX1 is bent by the reflecting unit 25XA to be parallel to the Z axis and the +1st order diffracted light EX1 travels toward the PBS surface A11 of the PBS member 24. At this time, the −1st order diffracted light DX2 from the diffraction grating 12 brought about by the measuring light MX comes perpendicularly into the grating pattern 12a, via the reflecting unit 25X, at a position shifted in the −X direction and the +Y direction from the position where the measuring light MX came into the grating pattern 12a symmetrically to the diffracted light DX1 (see FIG. 2B). Further, the optical path of the −1st order diffracted light EX2 generated, via diffraction of the diffracted light DX2, from the diffraction grating 12 is bent by the reflecting unit 25XB to be parallel to the Z axis and the −1st order diffracted light EX2 travels toward the PBS surface A11.

Figure 3B:
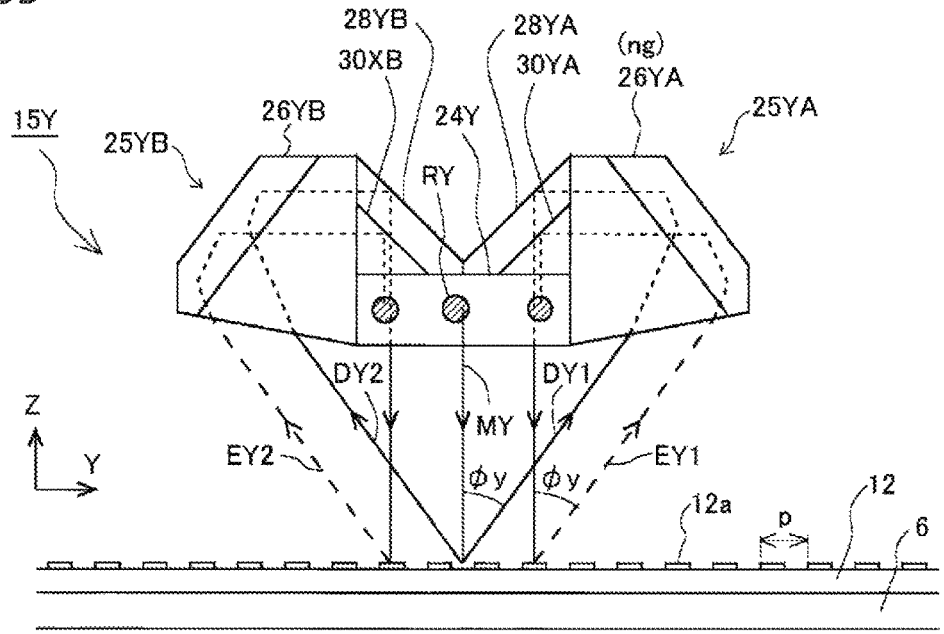
FIG. 3B is a diagram depicting optical paths of ±1st order diffracted lights in an Y-axis interferometer unit.

FIG. 3B depicts main components or parts of the Y-axis interferometer unit 15Y and the diffraction grating 12. In FIG. 3B, when the measuring light MY comes perpendicularly into the grating pattern 12a of the diffraction grating 12, the diffraction angle $\phi y$ of the +1st order diffracted light DY1 in the Y direction brought about by the measuring light MY is same as the diffraction angle "$\phi x$" in the X direction of the formula (1). The diffracted light DY1 reflected by the reflecting unit 25YA comes perpendicularly into the grating pattern 12a at a position shifted in the −X direction and the +Y direction from the position where the measuring light MY came into the grating pattern 12a. Meanwhile, the diffracted light DY2 reflected by the reflecting unit 25YB comes perpendicularly into the grating pattern 12a at a position shifted in the −X direction and the −Y direction from the position where the measuring light MY came into the grating pattern 12a. The optical path of +1st order diffracted light EY1 generated, via diffraction of the diffracted light DY1 traveled through the reflecting unit 25YA, from the diffraction grating 12 and the optical path of −1st order diffracted light EY2 generated, via diffraction of the −1st order diffracted light DY2 in the Y direction brought about by the measuring light MY, from the diffraction grating 12 are respectively bent by the reflecting units 25YA, 25YB to be parallel to the Z axis; and the ±1st order diffracted lights EY1 and EY2 travel toward the PBS surface of the PBS member 24Y.

Figure 4A:
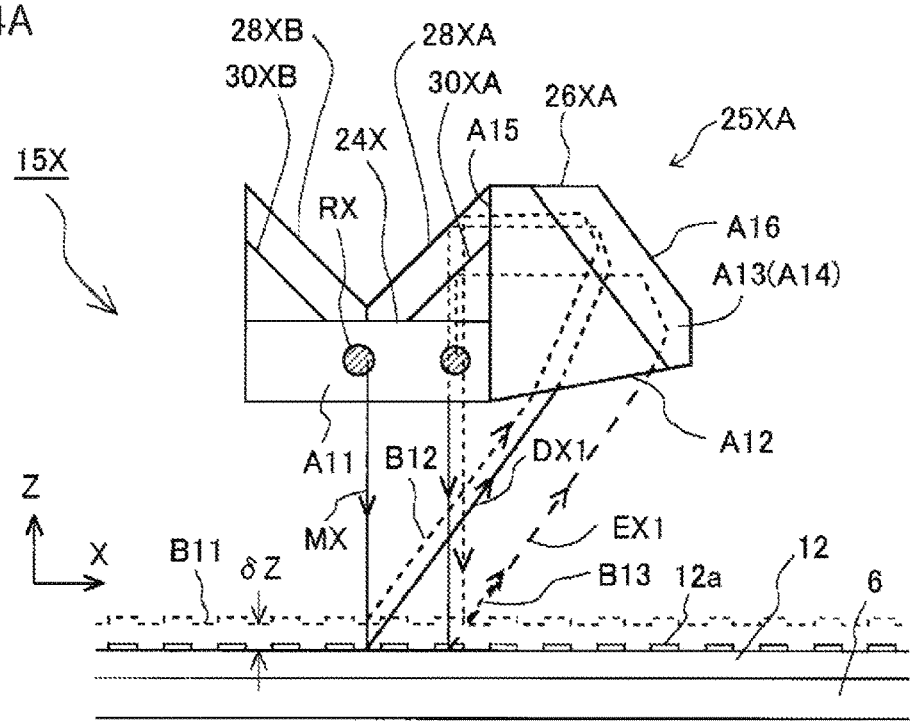
FIG. 4A is a diagram depicting a change in the optical path of the diffracted light when the relative height of a grating pattern surface is changed in the X-axis interferometer unit of FIG. 2A.

Further, the following case is assumed that in the arrangement depicted in FIG. 3A, the relative position in the Z direction of the grating pattern surface 12b of the diffraction grating 12 is changed relative to the interferometer unit 15X by δZ to a position B11, as depicted in FIG. 4A. In this case, the +1st order diffracted light DX1 brought about by the measuring light MX comes into the reflecting unit 25XA in a state that the optical path of the +1st order diffracted light DX1 is parallely shifted to a position B12. In the reflecting unit 25XA, the optical path of the exiting light is shifted symmetrically to the shift of the optical path of the incoming light about the center (ridge line A16). Thus, the diffracted light DX1 reflected by the reflecting unit 25XA comes into the diffraction grating 12 at a position where the grating pattern surface 12b, of which position has been changed to the position B11, crosses the optical path of the +1st order diffracted light EX1 which is provided under the condition that the relative position in the Z direction of the grating pattern surface 12b is not changed. Accordingly, even when the grating pattern surface 12b is changed or shifted to the position B11, an optical path B13 of the +1st order diffracted light EX1 generated, via diffraction of the diffracted light DX1, from the diffraction grating 12 is same as the optical path of the +1st order diffracted light EX1 obtained when the relative position in the Z direction of the grating pattern surface 12b is not changed. Therefore, when the diffracted light EX1 and the reference light RX1 are coaxially combined in the PBS surface A2 (see FIG. 1) to generate the interference light, there is not any relative lateral shift amount between the diffracted light EX1 and the reference light RX1; and thus there is no lowering of the ratio of alternating current signal (beat signal or signal component) of the detection signal which is obtained when the interference light is photo-electrically converted.

This is same also with the −1st order diffracted light DX2 in the X axis and ±1st order diffracted lights DY1 and DY2 in the Y axis; even when the relative position of the grating pattern surface 12b in the Z direction is changed, the ratios of the beat signals of the detection signals of the photoelectric sensors 40XA to 40YB depicted in FIG. 1 are not lowered. Accordingly, it is possible to measure the relative moving amount between the second member 7 and the first member 6 by using the detection signals with a high S/N ratio and high precision.

Figure 4B:
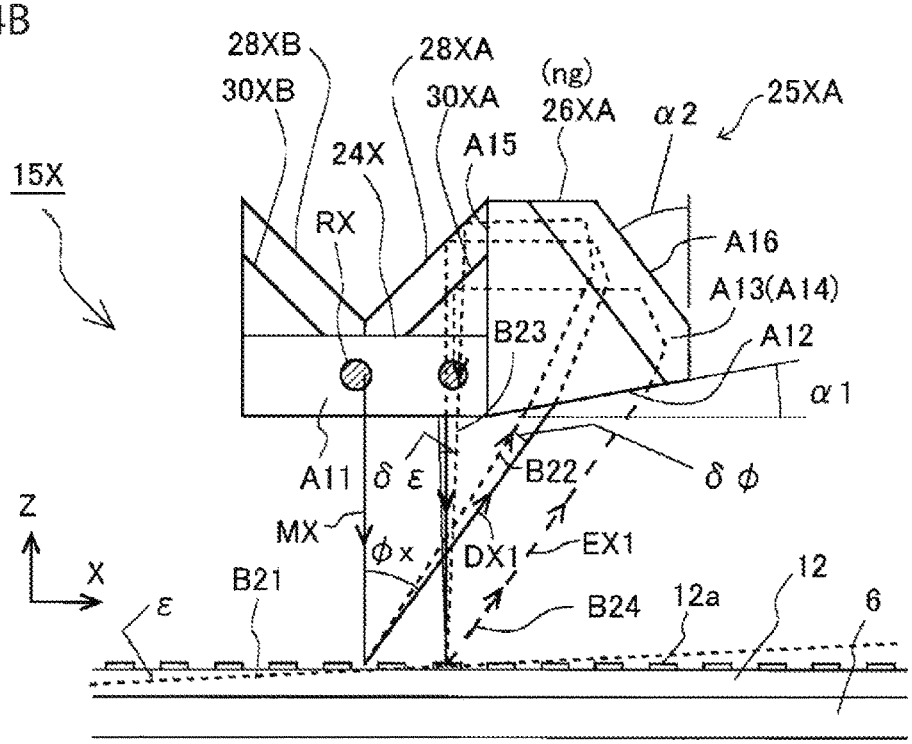
FIG. 4B is a diagram depicting a change in the optical path of the diffracted light when the grating pattern surface is relatively inclined.

Next, the following case is assumed that in the arrangement depicted in FIG. 3A, the grating pattern surface 12b of the diffraction grating 12 is changed relative to the X-axis interferometer unit 15X counterclockwise about an axis parallel to the Y axis by an angle ε, as depicted in FIG. 4B. In this case, provided that the incident angle of the measuring light MX with respect to the grating pattern surface 12b is ε, and that the diffraction angle of the +1st order diffracted light DX1 is (φx+δφx), the following relation holds.

$$\sin(\varphi x+\delta\varphi x)-\sin \varepsilon=\lambda/p \qquad (4)$$

In this case, when ε and δφx are minute amounts, sin(φx) differentiated is cos(φx), and thus the formula (4) is as follows.

$$\sin(\varphi x)+\cos(\varphi x)\cdot\delta\varphi x-\varepsilon=\lambda/p \qquad (5)$$

In the formula (5), considering that "sin(φx)" is "λ/p" from the formula (1), the following formula is obtained.

$$\delta\varphi x=\varepsilon/\cos(\varphi x) \qquad (6)$$

Further, an amount of change δφ of the angle of an optical path B22, of the +1st order diffracted light DX1 from the diffraction grating 12 when the grating pattern surface 12b is inclined by the angle ε, is as follows.

$$\delta\varphi=\{1+1/\cos(\varphi x)\}\varepsilon \qquad (7)$$

Furthermore, since the rate of change (dδ/di) of the deflection angle δ with respect to the incident angle i at the light-incident surface A12 of the roof prism 26XA is cos(φx) as indicated in the formula (3), an amount of change δε1 of the angle of an optical path B23 of the diffracted light DX1 transmitted through the roof prism 26XA is as follows:

$$\delta\varepsilon 1=\delta\varphi\cdot\cos(\varphi x)=\{\cos(\varphi x)+1\}\varepsilon \qquad (8)$$

Moreover, since the grating pattern surface 12b is inclined by the angle ε, an incident angle δε of the diffracted light DX1 coming into the grating pattern surface 12b from the reflecting unit 25XA is as follows.

$$\delta\varepsilon=\varepsilon\cdot\cos(\varphi x) \qquad (9)$$

When the diffracted light DX1 comes into the diffraction grating 12 again with the incident angle δε, an amount of change δφ1 of the diffraction angle of the +1st order diffracted light EX1 (double diffracted light) from the diffraction grating 12 brought about by the diffracted light DX1 is as follows from the formula (6).

$$\delta\varphi 1=\varepsilon \qquad (10)$$

This means that the amount of change δφ1 of the diffraction angle of the diffracted light EX1 is same as the inclination angle ε of the grating pattern surface 12b, namely that an optical path B24 of the diffracted light EX1 is parallel to the optical path before the grating pattern surface 12b is inclined. Further, any lateral shift of the optical path B24 of the diffracted light EX1 does not occur. Accordingly, when the diffracted light EX1 and the reference light RX1 are coaxially combined in the PBS surface A2 to generate the interference light, there are not any relative inclination shift amount and any relative lateral shift amount between the diffracted light EX1 and the reference light RX1; and thus there is no lowering of the ratio of alternating current signal (beat signal or signal component) of the detection signal which is obtained when the interference light is photo-electrically converted. This is same also with the −1st order diffracted light EX2 of the X axis.

Further, also in a case that the grating pattern 12b of the diffraction grating 12 is inclined about an axis parallel to the X axis, there are not generated any shift in the inclination angle of the optical path and any lateral shift of the optical path of each of the ±1st order diffracted lights EY1 and EY2 of the Y axis as well. Accordingly, the ratios of the beat signals of the detection signals of the photoelectric sensors 40XA to 40YB depicted in FIG. 1 are not lowered. Thus, it is possible to measure the relative moving amount of the second member 7 relative to the first member 6 by using the detection signals with a high S/N ratio and high precision. Note that in a case that the grating pattern surface 12b of the diffraction grating 12 is inclined about an axis parallel to the X axis (or the Y axis), the detection signals of the X axis (or the detection signals of the Y axis) are not substantially affected.

In the foregoing explanation, it is assumed that the diffraction grating 12 side is inclined to the detection head 14 (interferometer units 15X, 15Y). However, also in a case that the incident angle of each of the measuring lights MX, MY with respect to the diffraction grating 12 is changed from 0 (zero) by a minute amount in the X direction and/or the Y direction, there is not any inclination and lateral shift of the optical path of each of the diffracted lights EX1, EX2, EY1 and EY2 as well. Thus, it is possible to measure the relative moving amount between the second member 7 and the first member 6 with a high S/N ratio and high precision.

The effects, etc. of the embodiment are as follows.

The encoder 10 of the embodiment is a three-axis encoder which measures the relative moving amount of the second member 7 movable relative to the first member 6 three-dimensionally in the X, Y and Z directions. Further, the encoder 10 is provided with the reflective-type diffraction grating 12 which is provided on the first member 6 and which has the two-dimensional grating pattern 12a of which periodic directions are the X and Y directions; the laser light source 16 which generates a laser light including the measuring light MX and the reference light RX; the PBS member 24X (first optical member) which is provided on the second member 7 and which causes the measuring light MX to be transmitted therethrough so that the measuring light MX comes substantially perpendicularly into the grating pattern surface 12b of the diffraction grating 12; the reflecting unit 25XA which is provided on the second member 7, which causes the +1st order diffracted light DX1 (first diffracted light) in the X direction generated via diffraction of the measuring light MX, from the diffraction grating 12, to come into the diffraction grating 12, and which causes the +1st order diffracted light EX1 (second diffracted light) in the X direction generated, via diffraction of the +1st order diffracted light DX1, from the diffraction grating 12 to come into the PBS member 24X; the reflecting unit 25XB which is provided on the second member 7, which causes the −1st order diffracted light DX2 (third diffracted light) generated via diffraction of the measuring light MX, from the diffraction grating 12, symmetrically to the diffracted light DX1 in the X direction to come into the diffraction grating 12, and which causes the −1st order diffracted light EX2 (fourth diffracted light) in the X direction generated, via diffraction of the −1st order diffracted light DX2, from the diffraction grating 12 to come into the PBS member 24X; the photoelectric sensors 40XA, 40XB which respectively detect interference lights generated by interference between reference lights branched from the reference light RX and the diffracted lights EX1 and EX2 reflected by the PBS member 24X; and the measurement calculation unit 42 (measuring unit) which measures the relative moving amounts in the X direction and the Z direction of the second member 7 relative to the first member 6 by using detection signals of the photoelectric sensors 40XA, 40XB.

Figure 12:
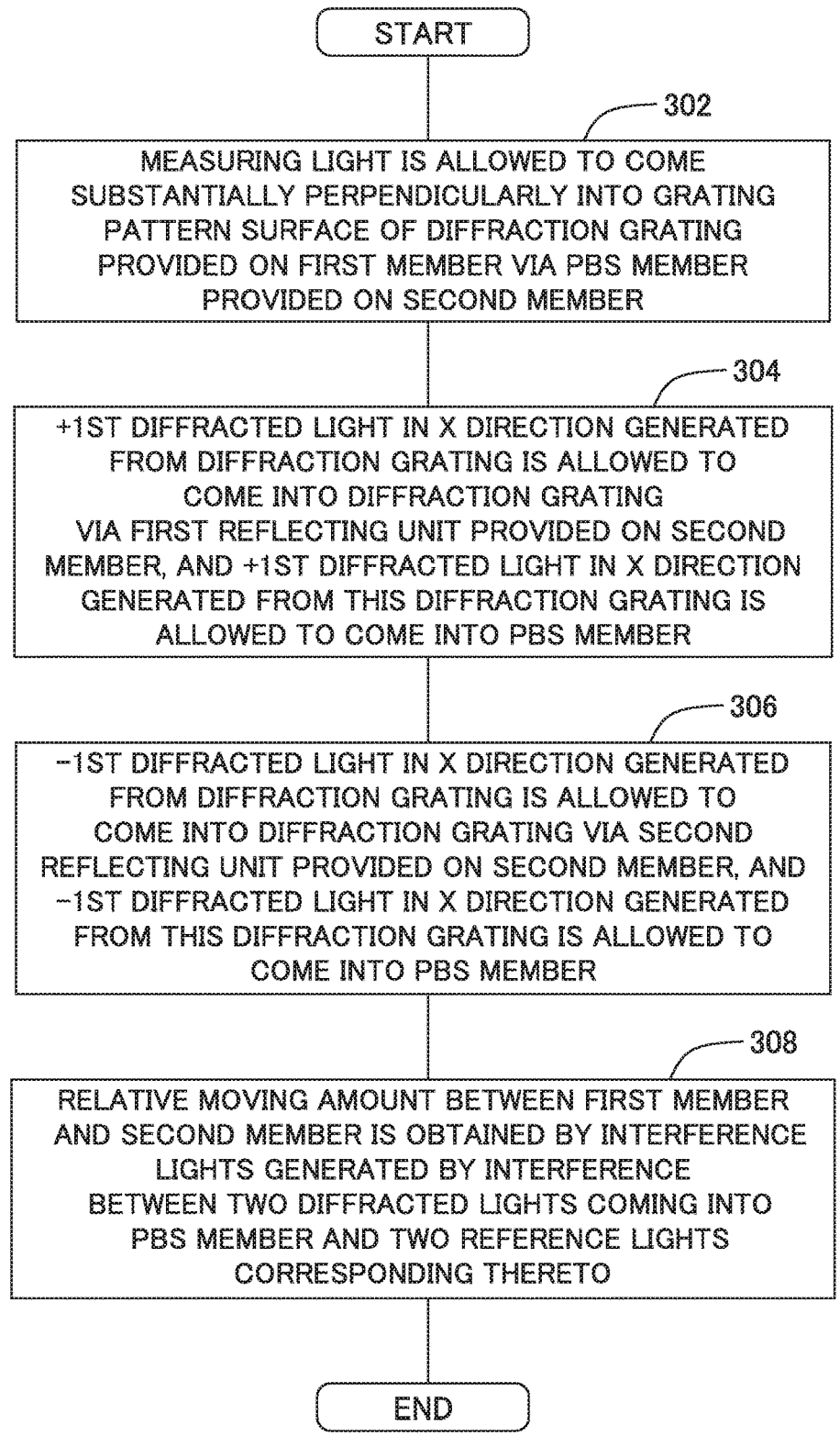
FIG. 12 is a flowchart indicating an exemplary measurement method.

As indicated in the flowchart of FIG. 12, the measurement method using the encoder 10 is a method for measuring the relative moving amount between the second member 7 and the first member 6, and includes a step 302 in which the measuring light MX is allowed to come substantially perpendicularly into the grating pattern surface 12b of the reflective-type diffraction grating 12 provided on the first member 6 and having the grating pattern 12a of which periodic directions are the X direction and the Y direction, via the PBS member 24X provided on the second member 7; a step 304 in which the +1st diffracted light DX1 in the X direction generated, via diffraction of the measuring light MX, from the diffraction grating 12, is allowed to come into the diffraction grating 12 via the reflecting unit 25XA provided on the second member 7, and the +1st order diffracted light EX1 generated, via diffraction of the diffracted light DX1, from the diffraction grating 12 is allowed to come into the PBS member 24X; a step 306 in which the −1st diffracted light DX2 in the X direction generated via diffraction of the measuring light MX, from the diffraction grating 12, is allowed to come into the diffraction grating 12 via the reflecting unit 25XB provided on the second member 7, and the −1st order diffracted light EX2 generated, via diffraction of the diffracted light DX2, from the diffraction grating 12 is allowed to come into the PBS member 24X; and a step 308 in which the interference lights generated by interference between the reference lights RX1, RX2 and the diffracted lights EX1, EX2 via the PBS member 24X are respectively detected, and the relative moving amount between the second member 7 and the first member 6 is obtained based on the detection results.

According to this embodiment, the incident angle of each of the diffracted lights DX1, DX2 when coming into the diffraction grating 12 is made to be substantially 0 (zero) by each of the reflecting units 25XA, 25XB. Therefore, even when the relative position between the first member 6 and the second member 7 is changed and consequently the relative height (position in the Z direction) of the grating pattern surface 12b of the diffraction grating 12 relative to the PBS member 24X (detection head 14) is changed, there is not any substantial variation or fluctuation in the optical path of each of the diffracted lights EX1, EX2 (double diffracted light) from the diffraction grating 12 brought about by each of the diffracted lights DX1, DX2, and the relative shift amount in the lateral direction between the diffracted light EX1 and the reference light RX1 and the relative shift amount in the lateral direction between the diffracted light EX2 and the reference light RX2 are each substantially 0 (zero). Accordingly, there is no lowering of the intensity of the beat signal (signal including the positional information) of the interference light with respect to the change in the height of the grating pattern surface 12b of the diffraction grating 12, thereby making it possible to maintain high measurement precision or accuracy of the relative moving amount of the second member 7 relative to the first member 6. On the other hand, if the relative positions in the X and Y directions between the first member 6 and the second member 7 are fixed, it is possible to measure the relative moving amount in the Z direction of the second member 7 relative to the first member 6 from the detection signal of the photoelectric sensor 40XA.

The encoder 10 further includes reflecting units 25YA, 25YB each of which causes one of the ±1st order diffracted lights DY1, DY2 to come into the diffraction grating 12 at the incident angle of substantially 0 (zero), the ±1st order diffracted lights DY1, DY2 being generated, via diffraction of the measuring light MY coming substantially perpendicularly into the diffraction grating 12 via the PBS member 24Y, from the diffraction grating 12 in the Y direction; and the photoelectric sensors 40YA, 40YB which respectively detect interference lights generated by interference between the reference lights RY1, RY2 and the ±1st order diffracted lights EY1, EY2 generated, via diffraction of the diffracted lights DY1, DY2, from the diffraction grating 12. Therefore, even when the relative height of the grating pattern surface 12b of the diffraction grating 12 is changed, it is possible to measure the relative moving amount in the Y direction of the second member 7 relative to the first member 6 from the detection signals of the photoelectric sensors 40YA, 40YB with high precision.

The following modifications may be made to the embodiment described above.

Although the two-dimensional diffraction grating 12 is used in the embodiment described above, it is allowable to use a one-dimensional diffraction grating which has the periodicity, for example, only in the X direction, instead of using the diffraction grating 12. In this case, it is allowable to omit the Y-axis interferometer unit 15Y, the photoelectric sensors 40YA, 40YB, and the like from the detection head 14; in this case, it is possible to measure the relative moving amounts in the X and Z directions between the first member 6 and the second member 7 by using the detection signals of the photoelectric sensors 40XA and 40XB.

In the embodiment, the interference lights generated by interference between the diffracted lights EX1, EX2, EY1 and EY2 and the reference lights RX1, RX2, RY1 and RY2, respectively, are detected. It is allowable, however, to detect for example an interference light generated by interference between a X-axis +1st order diffracted light EX1 of a measuring light having a first frequency and a X-axis −1st order diffracted light EX2 of a measuring light having a second frequency (the light used in the embodiment as the reference light), and to detect an interference light generated by interference between a Y-axis+1st order diffracted light EY1 of the measuring light having the first frequency and a Y-axis −1st order diffracted light EY2 of the measuring light having the second frequency. In this case, it is possible to measure the relative moving amounts between the first member 6 and the second member 7 in the X and Y directions, and to perform the measurement always with a high S/N ratio and high precision, since there is no lateral shift between the two diffracted lights even when the relative height of the grating pattern surface 12b of the diffraction grating 12 is changed or varied.

Figure 5A:
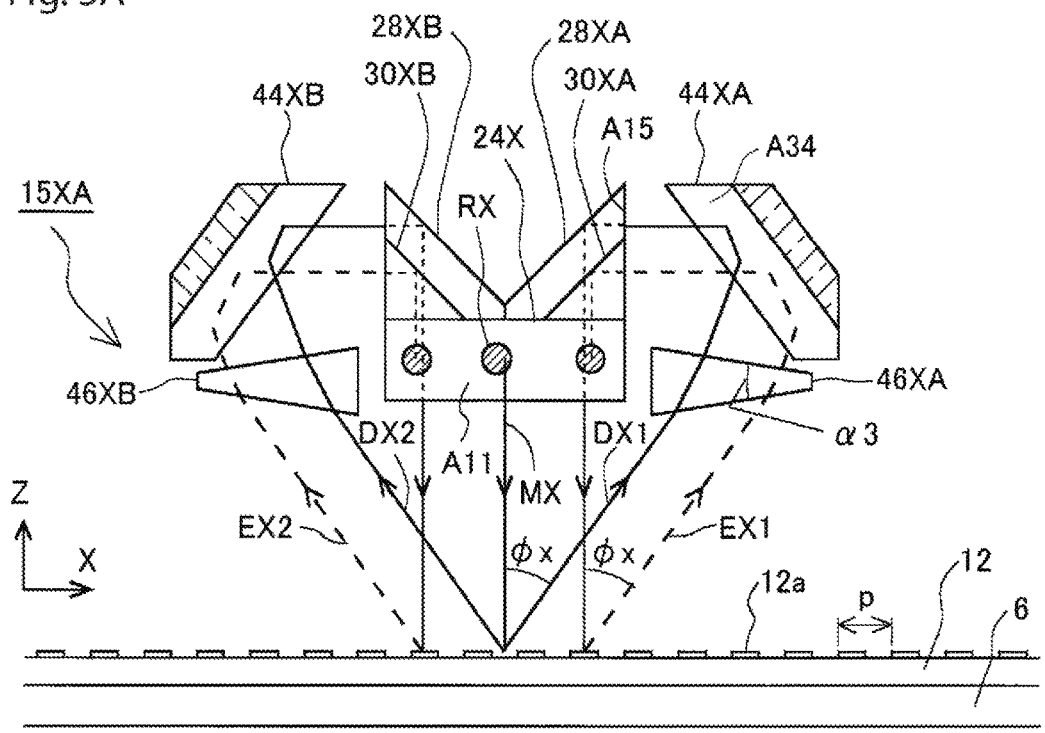
FIG. 5A is a diagram illustrating main components or parts of an X-axis interferometer unit according to a first modification of the present teaching.
Figure 5B:
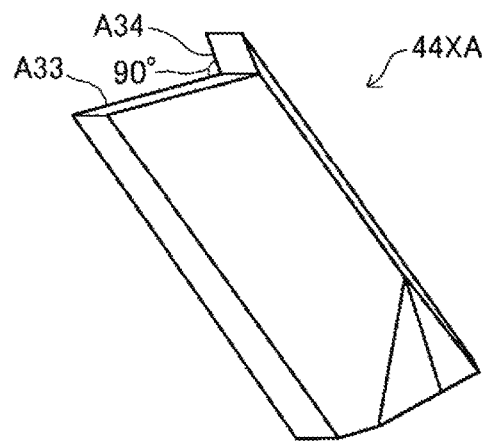
FIG. 5B is a perspective view depicting a roof mirror in FIG. 5A.

Subsequently, in the above embodiment, the diffracted lights DX1, EX1 generated from the diffraction grating 12 come into the reflecting members 28XA, 30XA respectively via the roof prism 26XA. However, as depicted in the main components of an X-axis interferometer unit 15XA of a first modification in FIG. 5A, it is allowable to use a roof mirror 44XA (see FIG. 5B) having reflecting surfaces A33, A34 which are orthogonal to each other and a wedge-shaped (cuneiform) prism 46XA having a vertical angle (apical angle) α3, instead of the roof prism 26XA. In this case, it is allowable to use a roof mirror 44XB and a wedge-shaped (cuneiform) prism 46XB instead of the roof prism 26XB. The use of the roof mirrors 44XA, 44XB may reduce weight of the X-axis interferometer unit 15XA. The wedge-shaped prisms 46XA, 46XB may be omitted. Similarly, planer mirrors may be used as the reflecting members 28XA, 30XA, etc.

Figure 6:
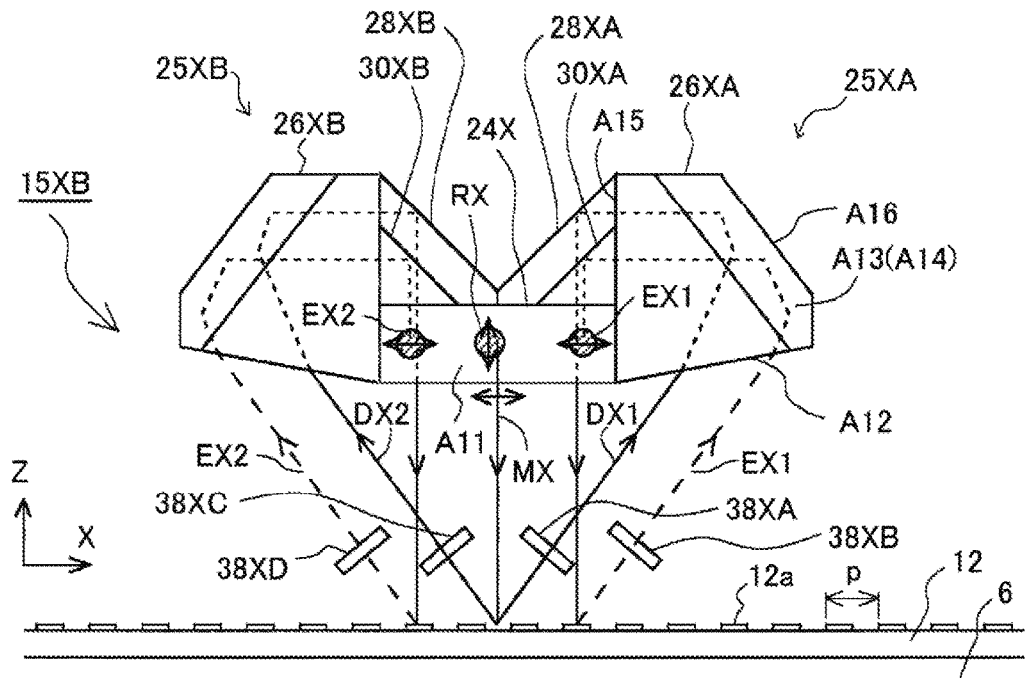
FIG. 6 is a diagram illustrating main components or parts of an X-axis interferometer unit according to a second modification of the present teaching.

As depicted in an X-axis interferometer unit 15XB of a second modification in FIG. 6, ½ wavelength plates 38XA, 38XB for adjusting the polarization directions of the +1st diffracted lights DX1, EX1 may be provided in the optical paths of the diffracted lights DX1, EX1 travelling from the diffraction grating 12 toward the reflecting unit 25XA, and ½ wavelength plates 38XC, 38XD for adjusting the polarization directions of the −1st diffracted lights DX2, EX2 may be provided in the optical paths of the diffracted lights DX2, EX2 travelling from the diffraction grating 12 toward the reflecting unit 25XB. The rotation angles of the ½ wavelength plates 38XA, 38XB, 38XC, and 38XD can be adjusted. As an example, the rotation angles of the ½ wavelength plates 38XA, 38XC are adjusted so that the light amounts of the diffracted lights DX1, DX2 coming into the diffraction grating 12 after passing through the reflecting units 25XA, 25XB and the PBS member 24X are maximized respectively, and the rotation angles of the ½ wavelength plates 38XB, 38XD are adjusted so that the light amounts of the diffracted lights EX1, EX2 reflected by the PBS surface A11 of the PBS member 24X via the reflecting units 25XA, 25XB respectively, are maximized.

Accordingly, even when the polarization directions of the diffracted lights DX1, EX1, etc., are changed due to the diffraction by the diffraction grating 12, the polarization directions of the diffracted lights DX1, EX1, etc., coming into the PBS member 24X can be optimized to minimize light amount loss. The diffracted lights DX1, DX2 are transmitted through the PBS member 24X to come into the diffraction grating 12, and thus the light amount loss is small even when the polarization directions of the diffracted lights DX1, DX2 are changed. Therefore, the ½ wavelength plates 38XA, 38XC on the optical paths of the diffracted lights DX1, DX2 may be omitted.

Figure 7:
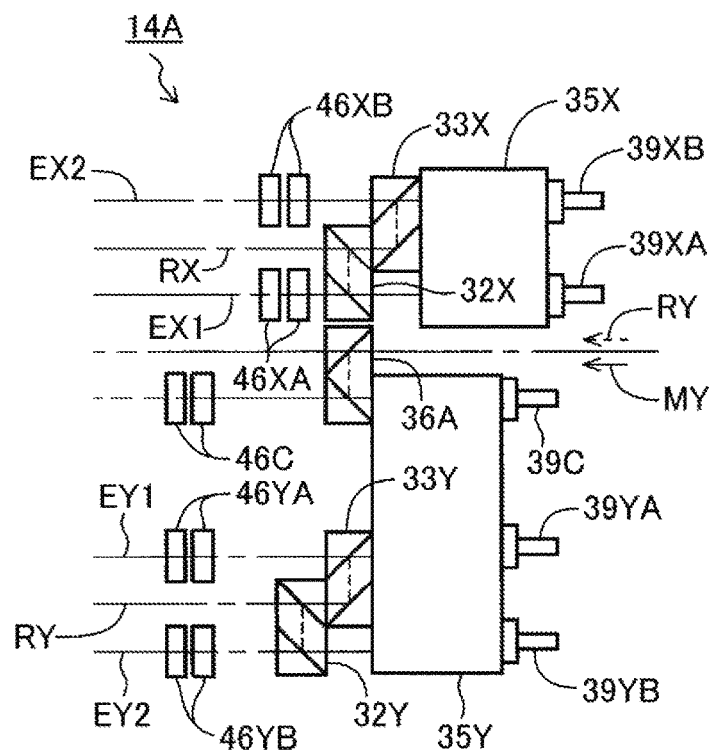
FIG. 7 is a plan view depicting a part of a detection head according to the first modification.

Further, as depicted in the main components of a detection head 14A of a first modification in FIG. 7, instead of using the wedge-shaped prisms 34X, 34Y in FIG. 1, a pair of deviation prisms (declination prisms) 46XA and a pair of deviation prisms 46XB may be provided on the optical paths of the X-axis diffracted lights EX1, EX2 (measuring lights) respectively; a pair of deviation prisms 46YA and a pair of deviation prisms 46YB may be provided on the optical paths of the Y-axis diffracted lights EY1, EY2 (measuring lights) respectively; and a pair of deviation prisms 46C may be provided on the optical path of the measuring light for comparison. In the above embodiment, the measuring light MX and the reference light RX supplied to the detection head 14A intersect at the angle β and the measuring light MY and the reference light RY supplied to the detection head 14A intersect at the angle β. Therefore, by adjusting the angles and the inclination directions of the diffracted lights EX1, EX2, EY1, EY2 and the measuring light for comparison by use of each of the deviation prisms 46XA, 46XB, 46YA, 46YB, and 46C to make the diffracted lights EX1, EX2, EY1, EY2 and the measuring light for comparison parallel to reference lights corresponding thereto, the S/N ratio of detection signal of the interference fringes can be improved.

The measuring lights MX, MY may be substantially parallel to the reference lights RX, RY, respectively, the lights MX, MY, RX, and RY being supplied to the detection heads 14. In this case, the wedge-shaped prisms 34X, 34Y or the deviation prisms 46XA, 46XB, 46YA, 46YB, and 46C are not required to be provided.

Figure 8:
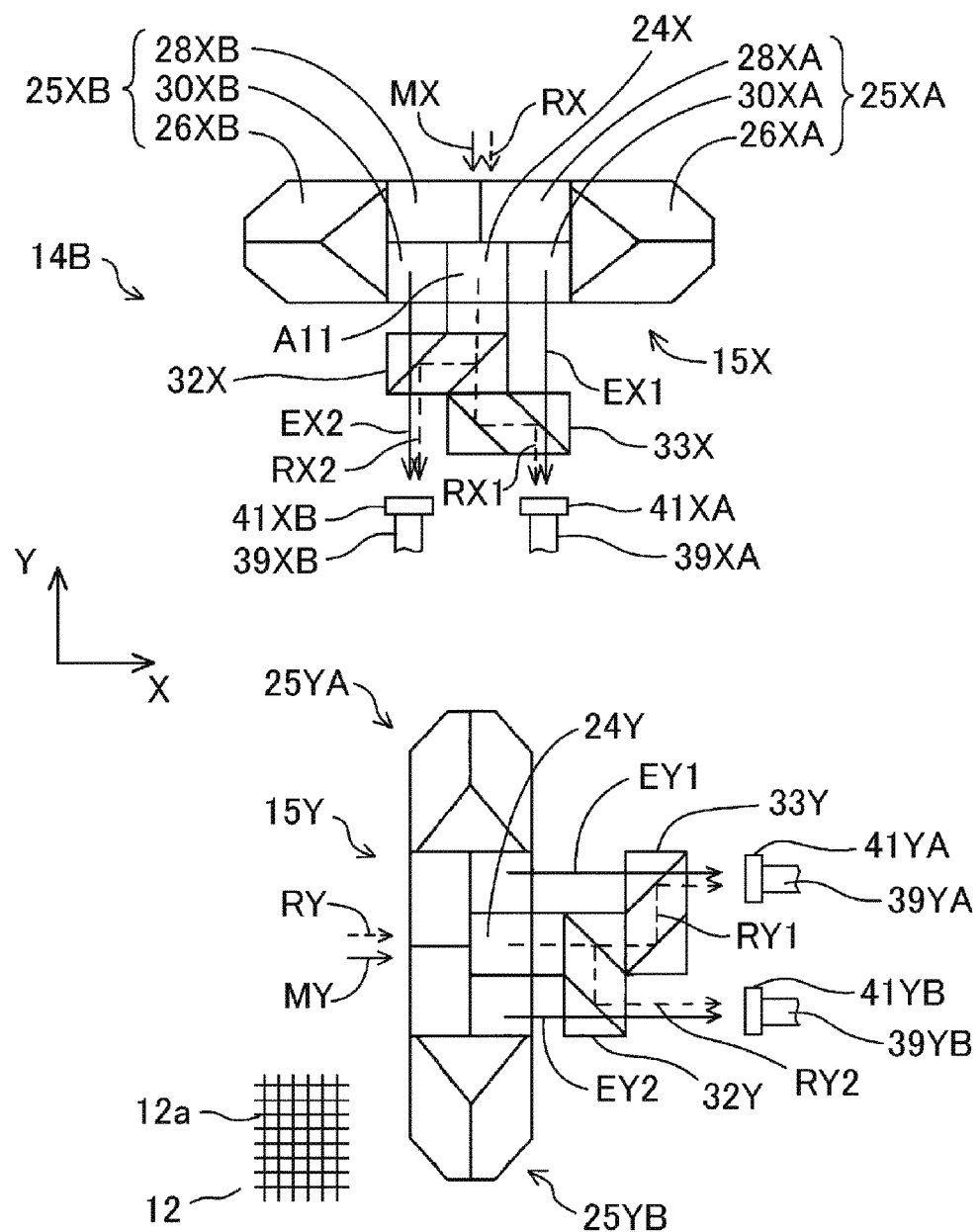
FIG. 8 is a plan view depicting main components or parts of a detection head according to the second modification.

Further, as depicted in the main components of a detection head 14B of a second modification in FIG. 8, the combining optical members 32X, 33X may be provided at the side of the light-exit surface of the PBS member 24X in the X-axis interferometer unit 15X, and the interference lights, which are generated by combining the diffracted lights EX1, EX2 and the reference lights RX1, RX2 by the PBS surfaces of the combining optical members 33X, 32X respectively, may come into the optical fibers 39XA, 39XB via the polarizing plates 41XA, 41XB, respectively. In this modification, the reference light RX transmitted through the PBS surface A11 of the PBS member 24X comes into the combining optical member 32X via an unillustrated wedge-shaped prism and is divided into the reference lights RX1, RX2 by the BS surface of the combining optical member 32X. The diffracted lights EX1, EX2 reflected by the PBS surface A11 of the PBS member 24X come into the combining optical members 33X, 32X respectively.

Similarly, the combining optical members 32Y, 33Y may be provided at the side of the light-exit surface of the PBS member 24Y in the Y-axis interferometer unit 15Y, and the interference lights, which are generated by combining the diffracted lights EY1, EY2 and the reference lights RY1, RY2 by the PBS surfaces of the combining optical members 33Y, 32Y respectively, may come into the optical fibers 39YA, 39YB via the polarizing plates 41YA, 41YB, respectively. In this case also, the reference light RY transmitted through the PBS member 24Y comes into the combining optical member 32Y via an unillustrated wedge-shaped prism and is divided into the reference lights RY1, RY2 by the BS surface of the combining optical member 32Y. This construction can further downsize the detection head 14B.

Second Embodiment

Figure 9:
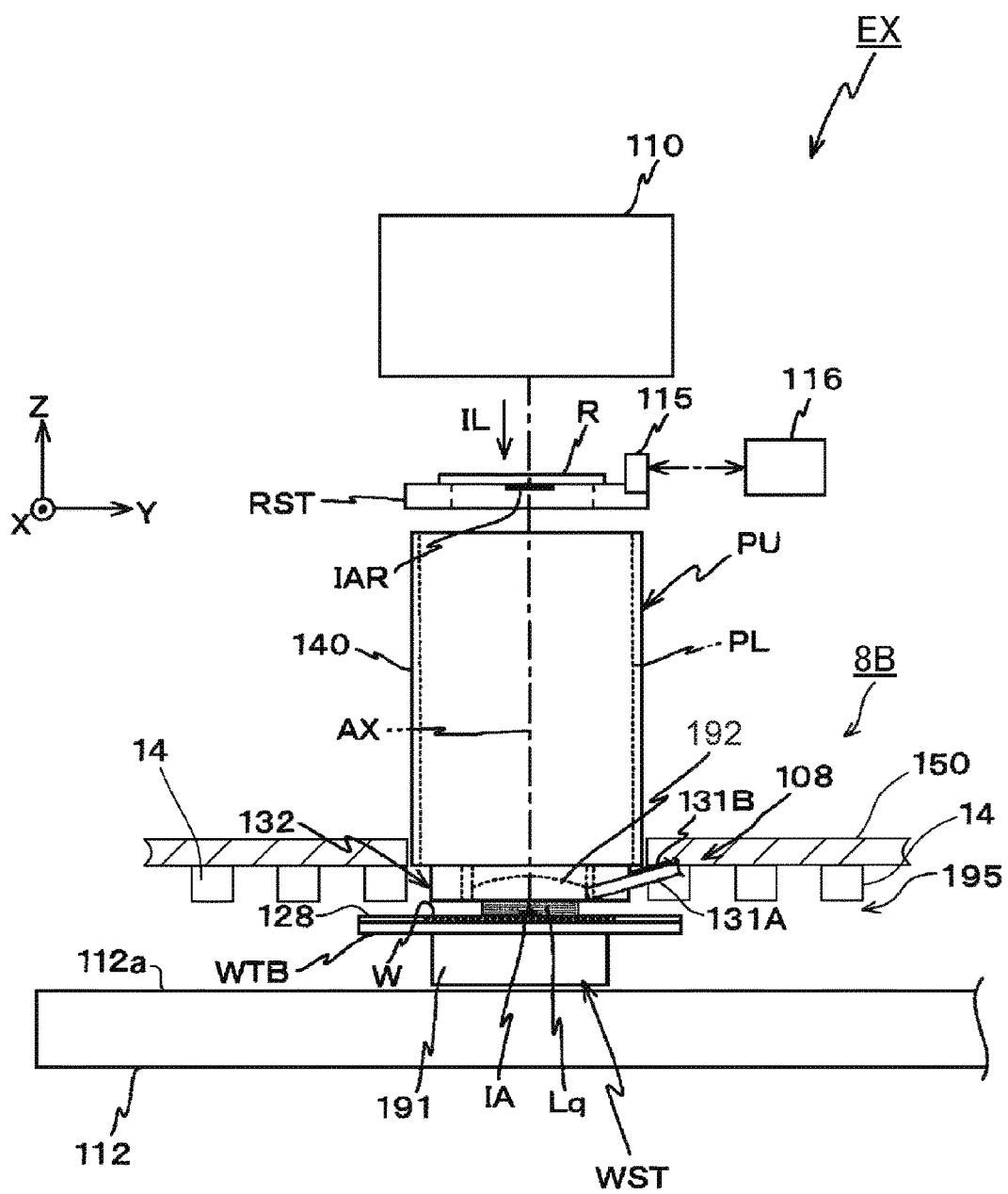
FIG. 9 is a schematic view depicting the construction of an exposure apparatus according to a second embodiment of the present teaching.

A second embodiment of the present teaching will be explained with reference to FIGS. 9 to 11. FIG. 9 is a schematic view depicting the construction of an exposure apparatus EX provided with an encoder device according to the second embodiment of the present teaching. The exposure apparatus EX is a projection exposure apparatus of the scanning exposure type constructed of a scanning stepper. The exposure apparatus EX is provided with a projection optical system PL (projection unit PU). In the following explanation, it is assumed that the Z axis is the axis extending in the direction parallel to an optical axis AX of the projection optical system PL, the Y axis is the axis extending in the direction in which a reticle R and a wafer W are subjected to the relative scanning in a plane (substantially a horizontal plane) orthogonal to the Z axis, and the X axis is the axis extending in a direction orthogonal to the Z axis and the Y axis.

The exposure apparatus EX is provided with an illumination system 110 disclosed, for example, in United States Patent Application Publication No. 2003/0025890; and a reticle stage RST which holds a reticle R (mask) illuminated with an illumination light (illumination light beam; exposure light) IL for the exposure (for example, an ArF excimer laser light beam having a wavelength of 193 nm and a high harmonic wave of a solid-state laser (a semiconductor laser, etc.)) from the illumination system 110. Further, the exposure apparatus EX is provided with the projection unit PU including the projection optical system PL which projects the illumination light IL exiting from the reticle R onto the wafer W (substrate); a stage device 195 including a wafer stage WST which holds the wafer W; a control system; etc. (see FIG. 11).

The reticle R is held to the upper surface of the reticle stage RST by means of the vacuum attraction, etc. A circuit pattern, etc., is formed on a pattern surface (lower surface) of the reticle R. The reticle stage RST is finely movable in the XY plane and is capable of being driven in the scanning direction (Y direction) at a designated scanning velocity by a reticle stage driving system 111, depicted in FIG. 11, including for example a linear motor, etc.

The position information (including the positions in the X and Y directions and the rotational angle in the θz direction) of the reticle stage RST in the movement plane thereof is always detected at a resolution of, for example, about 0.5 nm to about 0.1 nm via a movement mirror 115 (or a mirror-finished side surface of the stage) by a reticle interferometer 116 including a laser interferometer. A measured value by the reticle interferometer 116 is sent to a main controller 120, depicted in FIG. 11, constructed of a computer. The main controller 120 controls the reticle stage driving system 111 based on the measured value of the reticle interferometer 116 to thereby control the position and velocity of the reticle stage RST.

In FIG. 9, the projection unit PU arranged at a position below or under the reticle stage RST is provided with a barrel 140 and the projection optical system PL including a plurality of optical elements which are held in a predetermined positional relation inside the barrel 140. The projection optical system PL is, for example, telecentric on the both sides and has a predetermined projection magnification β (for example, reduction magnification such as ¼, ⅕, etc.). When an illumination area IAR of the reticle R is illuminated with the illumination light IL from the illumination system 110, an image of the circuit pattern in the illumination area IAR of the reticle R is formed via the projection optical system PL in an exposure area IA (area conjugated with the illumination area IAR) in one shot area of the wafer (semiconductor wafer) W by the illumination light IL allowed to pass through the reticle R.

Further, the exposure apparatus EX is provided with a nozzle unit 132 which constructs a part or portion of a local liquid immersion device 108 so as to surround an lower end portion of the barrel 140 holding an end-portion lens 192 which is included in the plurality of optical elements constructing the projection optical system PL and which is an optical element closest to the image plane side (closest to the wafer W side), for the purpose of performing the exposure to which the liquid immersion method is applied. The nozzle unit 132 is connected to a liquid supply device 186 and a liquid recovery device 189 (see FIG. 11) via a supply tube 131A for supplying a liquid Lq for exposure (for example, pure water or purified water) and a recovery tube 131B, respectively. Note that when the exposure apparatus EX is an exposure apparatus which is not of the liquid immersion type, the local liquid immersion device 108 may be omitted.

The wafer stage WST is supported in a non-contact manner via, for example, a plurality of un-illustrated vacuum pre-loadable pneumatic static pressure bearings (air pads) on an upper surface 112a, of a base plate 112, which is parallel to the XY plane. The wafer stage WST can be driven in the X and Y directions by, for example, a stage driving system 124 (see FIG. 11) including a planer motor or two pairs of linear motors orthogonal to each other. Further, the exposure apparatus EX is provided with a spatial image-measuring system (not depicted) which performs alignment of the reticle R; an alignment system AL (see FIG. 11) which performs alignment of the wafer W; a multipoint autofocus sensor 90 (see FIG. 11) of the oblique incidence system which includes a light-emitting system 90a and a light-receiving system 90b and which measures the positions in the Z direction of a plurality of points on a surface of the wafer W; and an encoder device 8B which measures positional information of the wafer stage WST.

The wafer stage WST is provided with a body 191 of the wafer stage (stage body 191) which is driven in the X and Y directions; a wafer table WTB arranged on the stage body 191; and a Z-leveling mechanism which is provided inside the stage body 191 and which finely drives the position in the Z direction, the tilt angles in the θx and θy directions of the wafer table WTB (wafer W) with respect to the stage body 191. A wafer holder (not depicted in the drawing), which holds the wafer W by the vacuum attraction, etc., on a suction surface substantially parallel to the XY plane, is provided on the wafer table WTB at an upper and central portion of the wafer table WTB.

Further, a flat plate-shaped plate body 128 having a high flatness is provided on the upper surface of the wafer table WTB. The plate body 128 has a surface (or a protective member) which is subjected to the liquid-repellent treatment for the liquid Lq and which is provided to be substantially flush with the surface of the wafer (wafer surface) placed on the wafer holder. The outer shape (contour) of the plate body 128 is rectangular, and a circular-shaped opening is formed in the central portion of the plate body 128, the opening being greater to some extent than the wafer holder (a wafer-placement area).

Figure 10:
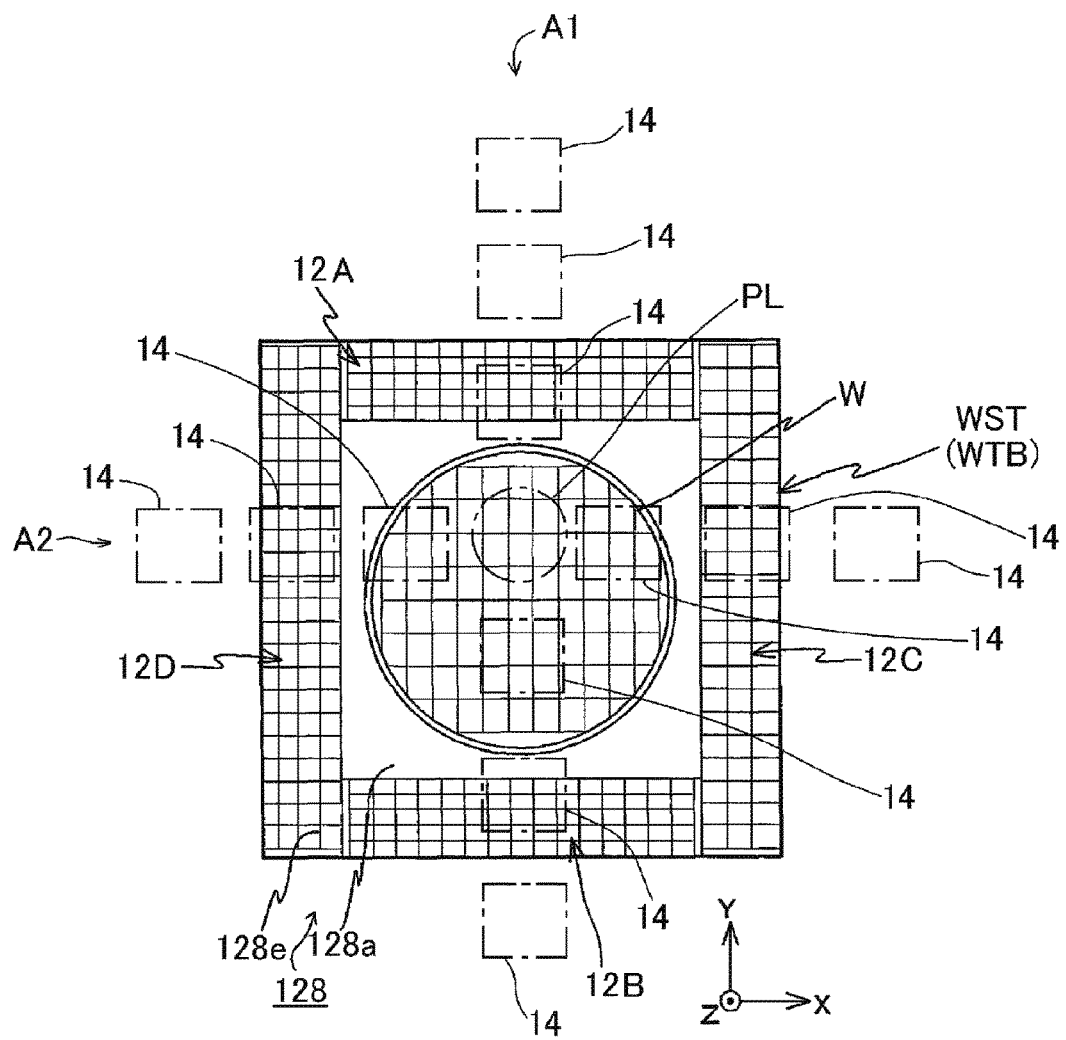
FIG. 10 is a plan view depicting an example of the arrangement of a diffraction grating provided on a wafer stage depicted in FIG. 9 and a plurality of detection heads.
Figure 11:
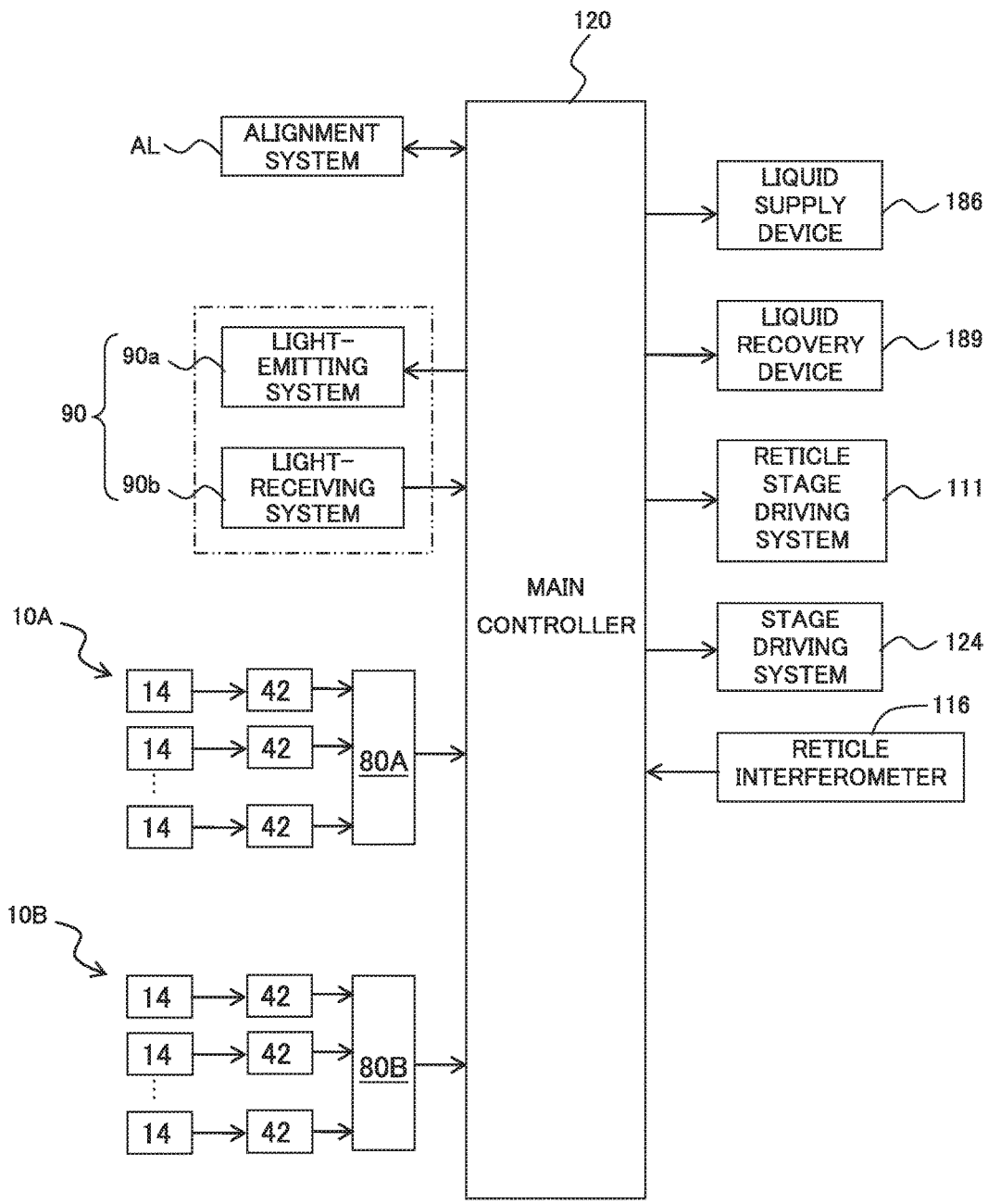
FIG. 11 is a block diagram depicting a control system of the exposure apparatus depicted in FIG. 9.

Note that in the structure of the exposure apparatus of the so-called liquid immersion type which is provided with the local liquid immersion device 108 as described above, the plate body 128 further has a plate portion (liquid-repellent plate) 128*a* which has a rectangular outer shape (contour) surrounding the circular-shaped opening, and which has a surface subjected to the liquid-repellent treatment; and a periphery portion 128*e* surrounding the plate portion 128*a*, as depicted in FIG. 10 that is a plan view of the wafer table WTB (wafer stage WST). A pair of two-dimensional diffraction gratings 12A, 12B and a pair of two-dimensional diffraction gratings 12C, 12D are arranged on the upper surface of the periphery portion 128*e*. The pair of diffraction gratings 12A, 12B are elongated in the X direction so as to sandwich the plate portion 128*a* therebetween in the Y direction; and the pair of diffraction gratings 12C, 12D are elongated in the Y direction so as to sandwich the plate portion 128*a* therebetween in the X direction. Each of the diffraction gratings 12A to 12D is a reflective-type diffraction grating having a two-dimensional grating pattern of which periodic directions are the X and Y directions, similar to the diffraction grating 12 depicted in FIG. 1.

Further, in FIG. 9, a measurement frame 150 which is flat plate-shaped and which is substantially parallel to the XY plane is supported, via a connection member (not depicted in the drawing) by a frame (not depicted in the drawing) supporting the projection unit PU. A plurality of detection heads 14 having the same construction as that of the three-axis detection head 14 depicted in FIG. 1 is fixed to the bottom surface of the measurement frame 150 so that the plurality of detection heads 14 sandwich the projection optical system PL in the X direction; and a plurality of detection heads 14 having the same construction as that of the three-axis detection head 14 depicted in FIG. 1 is fixed to the bottom surface of the measurement frame 150 so that the plurality of detection heads 14 sandwich the projection optical system PL in the Y direction (see FIG. 10). Further, there are also provided one laser source or a plurality of laser sources (not depicted) similar to the laser light source 16 in FIG. 1 for supplying a laser light or laser light beam (measuring light and reference light) to the plurality of detection heads 14.

In FIG. 10, the Exposure apparatus EX is constructed such that, during a period in which the wafer W is being exposed with the illumination light from the projection optical system PL, any two of the plurality of detection heads 14 in a row A1 in the Y direction always face or are opposite to the diffraction gratings 12A and 12B and any two of the detection heads 14 in a row A2 in the X direction always face or are opposite to the diffraction gratings 12C and 12D. Each of the detection heads 14 in the row A1 irradiates the measuring light to the diffraction grating 12A or 12B, and supplies the detection signal of the interference light, generated by interference between the diffracted light generated from the diffraction grating 12A or 12B and the reference light, to one of measurement calculation units 42 (see FIG. 11) corresponding thereto. In a similar manner with the measurement calculation unit 42 depicted in FIG. 1, these measurement calculation units 42 obtain the relative positions (relative movement amounts) in the X, Y and Z directions of the wafer stage WST relative to the measurement frame 150 at a resolution of, for example, 0.5 nm to 0.1 nm, and supply the respective measured values to a measured value-switching unit 80A. The measured value-switching unit 80A supplies, to the main controller 120, the information about the relative positions supplied from measurement calculation units 42, among the measurement calculation units 42, corresponding to the detection heads 14 facing the diffraction gratings 12A and 12B, respectively.

Further, each of the detection heads 14 corresponding to or aligned in the row A2 irradiates the measuring light to the diffraction gratings 12C or 12D, and supplies the detection signal of the interference light, generated by interference between the diffracted light generated from the diffraction grating 12C or 12D and the reference light, to one of measurement calculation units 42 (see FIG. 11) corresponding thereto. In a similar manner with the measurement calculation unit 42 depicted in FIG. 1, these measurement calculation units 42 obtain the relative positions (relative movement amounts) in the X, Y and Z directions of the wafer stage WST relative to the measurement frame 150 at a resolution of, for example, 0.5 nm to 0.1 nm, and supply the respective measured values to a measured value-switching unit 80B. The measured value-switching unit 80B supplies, to the main controller 120, the information about the relative positions supplied from measurement calculation units 42, among the measurement calculation units 42, corresponding to the detection heads 14 facing the diffraction gratings 12C and 12D, respectively.

A three-axis encoder 10A is constructed of the plurality of detection heads 14 in the row A1, the laser light source (not depicted), the measurement calculation units 42 and the diffraction gratings 12A and 12B; and a three-axis encoder 10B is constructed of the plurality of detection heads 14 in the row A2, the laser light source (not depicted), the measurement calculation units 42 and the diffraction gratings 12C and 12D. Further, the encoder device 8B is constructed of the three-axis encoders 10A and 10B and the measured value-switching units 80A and 80B. The main controller 120 obtains information about the position in the X, Y and Z directions, the rotational angle in the θz direction, etc. of the wafer stage WST with respect to the measurement frame 150 (the projection optical system PL), based on the information about the relative positions supplied from the encoder device 8B; and the main controller 120 drives the wafer stage WST via the stage driving system 124 based on these information.

When performing exposure by the exposure apparatus EX, at first, the reticle R and the wafer W are aligned with respect to each other. After that, an image of the pattern of the reticle R is transferred onto one shot area on the surface of the wafer W by performing a scanning exposure operation wherein the irradiation of the illumination light IL onto the reticle R is started and an image of a portion or part of the pattern of the reticle R is projected onto the one shot area via the projection optical system PL, while the reticle stage RST and the wafer stage WST are synchronously moved in the Y direction (subjected to synchronous scanning) at a velocity ratio of the projection magnification β of the projection optical system PL. After that, the operation in which the wafer W is step-moved in the X direction and the Y direction via the wafer stage WST and the scanning exposure operation described above are repeated. By doing so, the pattern image of the reticle R is transferred onto all the shot areas of the wafer W in the step-and-scan manner and based on or using the liquid immersion method.

At this time, the optical path lengths of the measuring light and the diffracted light in each of the detection heads 14 in the encoder device 8B are shorter than those in the laser interferometer. Therefore, the influence caused due to the fluctuation of the air and affecting the measured values obtained by using the detection heads 14 is very small. Thus, since the encoder device 8B of the embodiment has in particular excellent measurement stability in such a short term that the air is fluctuated (excellent short-term stability) as compared to the laser interferometer, it is possible to transfer the image of the pattern of the reticle R onto the wafer W highly precisely. Further, each of the detection heads 14 is capable of detecting the signal including the information about the relative moving amount always with high S/N ratio, even when the position in the Z direction of one of the diffracted gratings 12A to 12D is changed. Therefore, the wafer stage WST can be driven always with a high precision.

Note that in this embodiment, the detection heads 14 are arranged on the side of the measurement frame 150, and the diffraction gratings 12A to 12D are arranged on the side of the wafer stage WST. As another configuration different from the above-described configuration, it is allowable to arrange the diffraction gratings 12A to 12D on the side of the measurement frame 150 and to arrange the detection heads 14 on the side of the wafer stage WST. Alternatively, the diffraction gratings 12A to 12D may be arranged on the back surface of the wafer stage WST and the detection heads 14 may be arranged on the side closer to a surface table than the wafer stage WST.

Further, when the position information of the reticle stage RST is obtained, the encoder described in this embodiment may be used instead of or in conjunction with the reticle interferometer 116.

Figure 13:
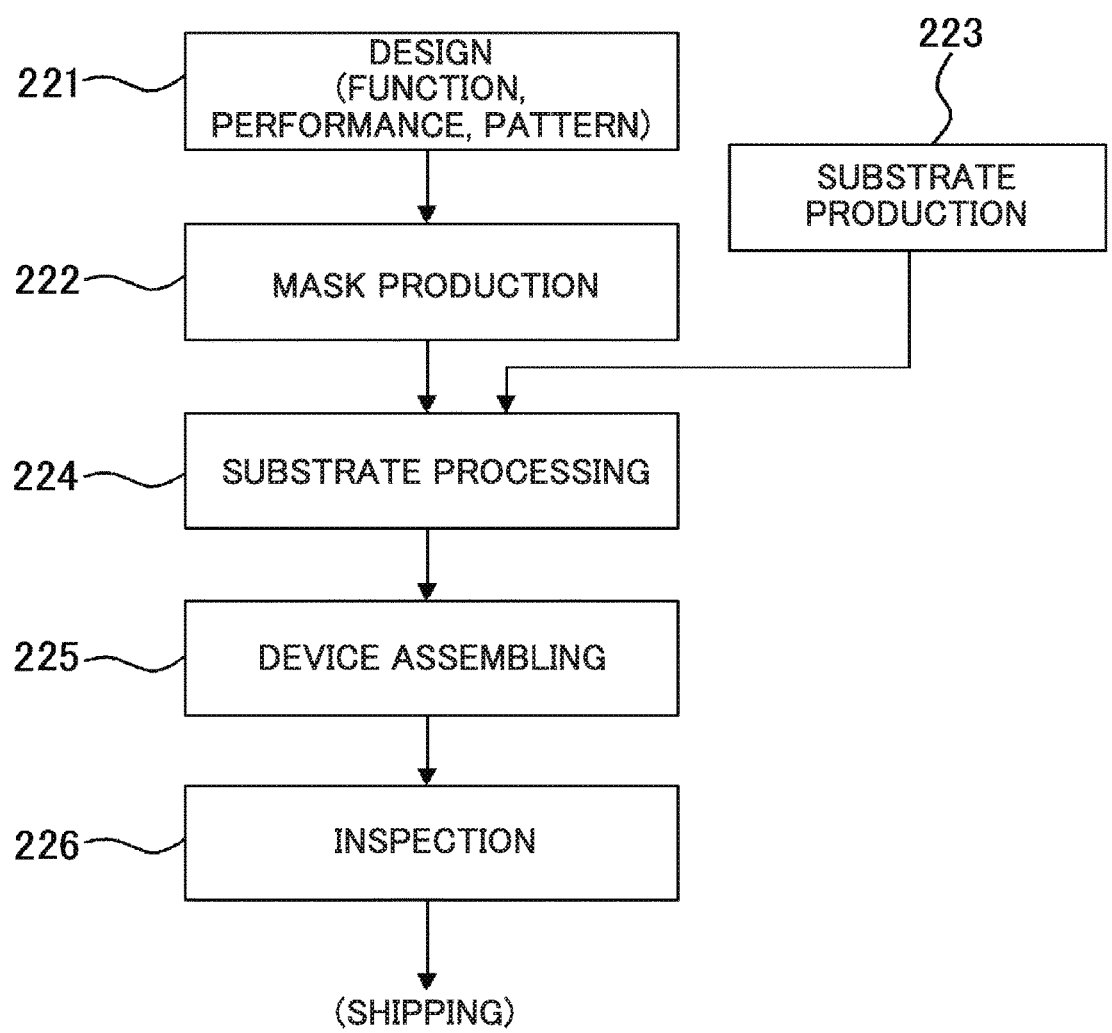
FIG. 13 is a flowchart indicating an example of a method for producing an electronic device.

Further, in a case that an electronic device (or a micro device) such as a semiconductor device is produced by using the exposure apparatus EX or the exposure method as referred to in the embodiments described above, the electronic device is produced, as shown in FIG. 13, by performing: a step 221 of designing the function and the performance of the electronic device; a step 222 of manufacturing a reticle (mask) based on the designing step; a step 223 of producing a substrate (wafer) as a base material for the device and of coating the substrate with a resist; a substrate-processing step 224 including a step of exposing the substrate (photosensitive substrate) with the pattern of the reticle by the exposure apparatus (exposure method) in the above embodiment(s), a step of developing the exposed substrate, a step of heating (curing) and etching the developed substrate, and the like; a step 225 of assembling the device (including processing processes such as a dicing step, a bonding step, a packaging step, etc.); an inspection step 226; and the like.

In other words, the method for producing the device includes the lithography step of transferring the image of the pattern of the reticle onto the substrate (wafer) by using the exposure apparatus EX (exposure method) of the above embodiments and developing the exposed substrate; and the step of processing the substrate, onto which the image of the pattern has been transferred, based on the image of the pattern (the etching, etc. in the step 224). According to the embodiments, since the position of the wafer stage WST of the exposure apparatus EX can be controlled with a high precision, it is possible to produce the electronic device highly precisely.

Further, the encoder 10 of each of the embodiments is applicable to an optical apparatus, other than the exposure apparatus, including: an optical system (optical system collecting a laser light, etc.) for an object-to-be-inspected or processed (inspection objective or processing objective), and a moving device (stage, etc.) which moves the object-to-be-inspected or processed, such as an inspection apparatus, a measuring apparatus, or the like, so that the encoder 10 measures a relative moving amount of the moving device (object-to-be-inspected or processed) relative to, for example, the optical system.

In the above embodiments, the explanation has been made by citing the step-and-scan projection exposure apparatus as an example, but the present teaching is applicable to the encoder in the step-and-repeat projection exposure apparatus.

The illumination light IL is not limited to the ArF excimer laser light beam (wavelength: 193 nm), and it is allowable to use ultraviolet light such as the KrF excimer laser light beam (wavelength: 248 nm) or vacuum ultraviolet light such as the $F_2$ laser light beam (wavelength: 157 nm). For example, as disclosed in the specification of U.S. Pat. No. 7,023,610, it is also appropriate to use the harmonic wave as the vacuum ultraviolet light, the harmonic wave being obtained by amplifying the single wavelength laser beam which is in the infrared region or the visible region and which is oscillated from the fiber laser or the DFB semiconductor laser with, for example, a fiber amplifier doped with erbium (or both of erbium and ytterbium) and performing the wavelength conversion to convert the amplified laser beam into the ultraviolet light by using the nonlinear optical crystal.

Further, the above embodiments can be applied also to an exposure apparatus using charged particle radiation such as the electron beam or the ion beam.

In the embodiments described above, the light-transmissive type mask (reticle) is used, in which a predetermined light-shielding pattern (or phase pattern or dimming or light-reducing pattern) is formed on the light-transmissive substrate. However, instead of this reticle, as disclosed, for example, in the specification of U.S. Pat. No. 6,778,257, it is also allowable to use an electronic mask (also referred to as "variable shaped mask", "active mask", or "image generator", and including, for example, Digital Micro-mirror Device (DMD) as a kind of the non-light emission type image display device (spatial light modulator)) on which a transmissive pattern, a reflective pattern, or a light-emitting pattern is formed based on the electronic data of the pattern to be subjected to the exposure. In a case that such a variable shaped mask is used, a stage on which a workpiece such as the wafer or the glass plate is placed is scanned relative to the variable shaped mask. Thus, it is possible to obtain the effect equivalent to the above embodiments by measuring the position of the stage by use of the encoder system.

For example, each of the embodiments of the present teaching is applicable to an exposure apparatus (lithography system), such as disclosed in International Publication No. 2001/035168, in which a line-and-space pattern is formed on a wafer W by forming interference fringes on the wafer W.

Further, for example, each of the embodiments of the present teaching is applicable to an exposure apparatus, such as disclosed in the specification of U.S. Pat. No. 6,611,316, in which two reticle patterns are combined (synthesized) on a wafer via a projection optical system, and one shot area on the wafer is subjected to the double exposure substantially simultaneously by means of one time of the scanning exposure.

In the embodiments described above, the object on which the pattern is to be formed (object as the exposure objective to be irradiated with the energy beam) is not limited to the wafer. The object may be any other object including, for example, glass plates, ceramic substrates, film members, and mask blanks.

The present teaching is not limited to the application to the exposure apparatus for producing the semiconductor device. The present teaching is also widely applicable, for example, to the exposure apparatus for transferring a liquid crystal display elements pattern onto a rectangular glass plate and the exposure apparatus for producing the organic EL, the thin film magnetic head, the image pickup device (for example, CCD), the micromachine, the DNA chip, and the like. Further, each of the above embodiments of the present teaching is applicable not only to the micro device such as the semiconductor device, but also to the exposure apparatus which transfers the circuit pattern, for example, to the glass substrate or the silicon wafer in order to produce the reticle or the mask to be used, for example, for the optical exposure apparatus, the EUV exposure apparatus, the X-ray exposure apparatus, and the electron beam exposure apparatus.

The measuring apparatus and the exposure apparatus of each of the embodiments is produced by assembling the various subsystems including the respective constitutive elements as recited in claims of this application so that the predetermined mechanical accuracy, the electrical accuracy, and the optical accuracy are maintained. In order to secure the various accuracies, those performed before and after the assembling include the adjustment for achieving the optical accuracy for the various optical systems, the adjustment for achieving the mechanical accuracy for the various mechanical systems, and the adjustment for achieving the electrical accuracy for the various electrical systems. The steps of assembling the various subsystems into the exposure apparatus include, for example, the mechanical connection, the wiring connection of the electric circuits, and the piping connection of the air pressure circuits among the various subsystems. It goes without saying that the steps of assembling the respective individual subsystems are performed before performing the steps of assembling the various subsystems into the exposure apparatus. When the steps of assembling the various subsystems into the exposure apparatus are completed, the overall adjustment is performed to secure the various accuracies of the entire exposure apparatus. It is also appropriate that the exposure apparatus is produced in a clean room in which, for example, the temperature and the cleanness are managed.

The disclosures of all of the above-mentioned patent documents, International Publications, United States Patent Publications, and United States Patents, those of which concern the exposure apparatus and the like are incorporated herein by reference in their entireties.

The entire disclosure contents of U.S. Patent Application No. 61/638,719 filed on Apr. 26, 2012 including the specification, claims, drawings, and abstract are incorporated by reference in this application in their entireties.

Note that it is a matter of course that the present teaching is not limited to the embodiments described above, and may be embodied in other various forms within a scope without deviating from the gist or essential characteristics of the present teaching.

According to the embodiments described above, since the first diffracted light is allowed to come into the diffraction grating via the first reflecting unit and the third diffracted light is allowed to come into the diffraction grating via the second reflecting unit, even when the height of the grating pattern surface of the diffraction grating relative to the first reflecting member is changed or varied, it is possible to reduce a relative shift amount between the second diffracted light generated, via diffraction of the first diffracted light, from the diffraction grating and other light beam than the second diffracted light and a relative shift amount between the fourth diffracted light generated, via diffraction of the third diffracted light, from the diffraction grating and other light beam than the fourth diffracted light. Therefore, it is possible to prevent the lowering of signal intensity of the interference light with respect to the change in the height of the grating pattern surface of the diffraction grating, thereby making it possible to maintain high measurement precision or accuracy.

What is claimed:

1. An encoder device configured to measure a relative moving amount between a first member and a second member, the second member being supported to be movable relative to the first member at least in a first direction, the encoder device comprising:
    a reflective-type diffraction grating provided on the first member and having a grating pattern of which periodic direction is at least the first direction;
    a light source unit configured to radiate a measuring light;
    a first optical member provided on the second member and causing the measuring light to come into a first position on a surface of the grating pattern of the diffraction grating;
    a first reflecting unit provided on the second member and causing a first diffracted light, which is generated, via diffraction of the measuring light, from the diffraction grating in the first direction, to come into a second position on the diffraction grating; and
    a second reflecting unit provided on the second member and causing a second diffracted light, of which order is different from an order of the first diffracted light and which is generated, via diffraction of the measuring light, from the diffraction grating in the first direction, to come into a third position on the diffraction grating,
    wherein both of the second position and the third position are different, in a second direction perpendicular to the first direction, from a first line segment at which a first plane and the reflective-type diffraction grating cross or intersect, the first plane including the first position, a path of the first diffracted light travelling from the diffraction grating to the first reflecting unit and a path of the second diffracted light travelling from the diffraction grating to the second reflecting unit.

2. The encoder device according to claim 1, wherein a second line segment, which passes through the first position in the second direction, is positioned on the reflective-type diffraction grating between the second position and the third position.

3. The encoder device according to claim 1, wherein a third line segment passing through the second position and the third position is parallel to the first line segment.

4. The encoder device according to claim 1, wherein the first reflecting unit transfers the first diffracted light in the second direction, and the second reflecting unit transfers the second diffracted light in the second direction.

5. The encoder device according to claim 1, wherein the first reflecting unit causes a third diffracted light, which is generated, via diffraction of the first diffracted light, from the diffraction grating, to come into the first optical member, and the second reflecting unit causes a fourth diffracted light, which is generated, via diffraction of the second diffracted light, from the diffraction grating, to come into the first optical member.

6. The encoder device according to claim 5, further comprising:
a first photo-detector configured to detect an interference light generated by interference between the third diffracted light via the first optical member and other light flux than the third diffracted light;
a second photo-detector configured to detect an interference light generated by interference between the fourth diffracted light via the first optical member and other light flux than the fourth diffracted light; and
a measuring unit configured to obtain the relative moving amount between the first member and the second member by using detection signals from the first and second photo-detectors.

7. The encoder device according to claim 1, wherein
the second position and the third position are located on a same side, in the second direction, relative to the first line segment.

8. An exposure apparatus configured to expose an object to be exposed with a pattern, the exposure apparatus comprising:
a frame;
a stage configured to support the object and configured to be movable relative to the frame at least in a first direction; and
the encoder device as defined in claim 1 configured to measure a relative moving amount between the frame and the stage at least in the first direction.

9. A method for measuring a relative moving amount between a first member and a second member, the second member being supported to be movable relative to the first member at least in a first direction, the method comprising:
causing a measuring light to come into a first position on a grating pattern, of which periodic direction is at least the first direction, of a reflective-type diffraction grating provided on the first member;
causing a first diffracted light, which is generated, via diffraction of the measuring light, from the diffraction grating in the first direction, to come into a second position on the diffraction grating; and
causing a second diffracted light, of which order is different from an order of the first diffracted light and which is generated, via diffraction of the measuring light, from the diffraction grating in the first direction, to come into a third position on the diffraction grating,
wherein both of the second position and the third position are different, in a second direction perpendicular to the first direction, from a first line segment at which a first plane and the reflective-type diffraction grating cross or intersect, the first plane including the first position, a path of the first diffracted light travelling from the diffraction grating to the first reflecting unit and a path of the second diffracted light travelling from the diffraction grating to the second reflecting unit.

10. The measuring method according to claim 9, wherein
a second line segment, which passes through the first position in the second direction, is positioned on the reflective-type diffraction grating between the second position and the third position.

11. The measuring method according to claim 9, wherein
a third line segment passing through the second position and the third position is parallel to the first line segment.

12. The measuring method according to claim 9, wherein
causing the first diffracted light to come into the second position includes causing the first diffracted light to be transferred in the second direction, and
causing the second diffracted light to come into the third position includes causing the second diffracted light to be transferred in the second direction.

13. The measuring method according to claim 9, wherein
the second position and the third position are located on a same side, in the second direction, relative to the first line segment.

14. An exposure method for exposing an object to be exposed with a pattern, the object being supported by a stage configured to be movable relative to a frame at least in a first direction, the exposure method comprising measuring a relative moving amount between the stage and the frame at least in the first direction by using the measuring method as defined in claim 9.

15. A method for producing a device, comprising a lithography step, wherein an object is exposed in the lithography step by using the exposure apparatus as defined in claim 8.

16. A method for producing a device, comprising a lithography step, wherein an object is exposed in the lithography step by using the exposure method as defined in claim 14.

17. An encoder device for measuring a relative moving amount between a first member having a diffraction grating and a second member, a positional relation between the first and second members being changeable at least in a first direction, the encoder device comprising:
a light splitter which splits a light from a light source so as to generate a measuring light to come into the diffraction grating and a reference light;
a first optical member which causes a first diffracted light to come into the diffraction grating, the first diffracted light being generated at the diffraction grating via diffraction of the measuring light coming into the diffraction grating;
a second optical member which causes a second diffracted light to come into the diffraction grating, the second diffracted light being generated at the diffraction grating via diffraction of the measuring light coming into the diffraction grating;
a first photo-detector which photo-electrically detects a first interference light generated by interference between a third diffracted light and the reference light, the third diffracted light being generated at the diffraction grating via diffraction of the first diffracted light coming into the diffraction grating;
a second photo-detector which photo-electrically detects a second interference light generated by interference between a fourth diffracted light and the reference light, the fourth diffracted light being generated at the diffraction grating via diffraction of the second diffracted light coming into the diffraction grating; and
a calculator which calculates the relative moving amount between the first and second members in the first direction by using a first output from the first photo-detector and a second output from the second photo-detector,
wherein, in the first direction, a second position at which the first diffracted light comes into the diffraction grating and a third position at which the second diffracted light comes into the diffraction grating are different from a first position at which the measuring light comes into the diffraction grating;

wherein the second position and the third position are different, in a second direction crossing the first direction, from the first position;

wherein the second position and the third position are located on a same side, in the second direction, relative to the first position.

18. The encoder device according to claim 17, wherein the calculator calculates a relative moving amount between the first and second members in the first direction and a relative moving amount between the first and second members in a third direction crossing a surface of the diffraction grating.

19. The encoder device according to claim 17, wherein the first optical member changes a travelling direction of the first diffracted light travelling to the diffraction grating such that the travelling direction is parallel to a travelling direction of the measuring light travelling to the diffraction grating.

20. The encoder device according to claim 17, wherein a travelling direction of the measuring light travelling to the diffraction grating is perpendicular to a surface of the diffraction grating.

21. The encoder device according to claim 17 wherein the light splitter reflects one portion of the light from the light source so as to generate the measuring light and transmits another portion of the light from the light source through the light splitter so as to generate the reference light, or the light splitter transmits one portion of the light from the light source through the light splitter so as to generate the measuring light and reflects another portion of the light from the light source so as to generate the reference light.

22. An exposure apparatus which expose a pattern onto an object to be exposed, the exposure apparatus comprising:

a frame;

a stage which supports the object to be exposed and which is capable of moving relative to the frame at least in a first direction; and the encoder device as defined in claim 17 configured to measure a relative moving amount between the frame and the stage at least in the first direction.

* * * * *